(12) United States Patent  
Kuo et al.

(10) Patent No.: US 10,133,375 B2
(45) Date of Patent: Nov. 20, 2018

(54) TOUCH PANEL HAVING ELECTRODES AND ROUTINGS ON SINGLE LAYER

(71) Applicant: MStar Semiconductor, Inc., Hsinchu Hsien (TW)

(72) Inventors: Wei-Lun Kuo, Hsinchu (TW); Kai-Ting Ho, Taipei (TW); Guo-Kiang Hong, Zhubei (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 15/092,839

(22) Filed: Apr. 7, 2016

(65) Prior Publication Data

US 2016/0231836 A1    Aug. 11, 2016

Related U.S. Application Data

(63) Continuation of application No. 13/910,492, filed on Jun. 5, 2013.

(60) Provisional application No. 61/656,535, filed on Jun. 7, 2012.

(51) Int. Cl.
| | |
|---|---|
| G06F 3/041 | (2006.01) |
| G06F 3/045 | (2006.01) |
| H03K 17/96 | (2006.01) |
| H05K 7/02 | (2006.01) |
| G06F 3/044 | (2006.01) |

(52) U.S. Cl.
CPC .............. G06F 3/041 (2013.01); G06F 3/044 (2013.01); H03K 17/962 (2013.01); H03K 17/9622 (2013.01); H05K 7/02 (2013.01); G06F 2203/04104 (2013.01); H03K 2017/9602 (2013.01)

(58) Field of Classification Search
CPC ............. H03K 17/962; H03K 17/9622; H03K 2017/9602; G06F 3/004; H05K 7/02
USPC ................................................. 345/173, 174
See application file for complete search history.

(56) References Cited

U.S. PATENT DOCUMENTS

| 8,477,106 B2* | 7/2013 | Salaverry ................ G06F 3/044 345/174 |
| 8,754,662 B1* | 6/2014 | Weng ...................... G06F 3/044 324/686 |
| 8,866,491 B2* | 10/2014 | Ksondzyk .............. G01N 27/22 324/601 |
| 9,207,814 B2* | 12/2015 | Yilmaz ................... G06F 3/044 |
| 2010/0085326 A1 | 4/2010 | Anne |

(Continued)

FOREIGN PATENT DOCUMENTS

CN           201725120 U       1/2011

*Primary Examiner* — Kwang-Su Yang
(74) *Attorney, Agent, or Firm* — Edell, Shapiro & Finnan, LLC

(57) ABSTRACT

A touch panel includes electrodes and routings disposed on a single conductive layer. The electrodes and routings are connected to drivers and sensors to sense mutual capacitance changes induced by a touch among the electrodes. The touch panel includes a first electrode, a second electrode, and a first routing connected to the first electrode. The second electrode includes two sub-electrodes respectively disposed at two sides of the first routing. The first electrode has a first jigsaw section, and the second electrode has a second jigsaw section mutually intervening with the first jigsaw section in an insulated manner.

3 Claims, 22 Drawing Sheets

(56) References Cited

U.S. PATENT DOCUMENTS

| | | | |
|---|---|---|---|
| 2010/0309167 A1* | 12/2010 | Nam | G06F 3/044 |
| | | | 345/174 |
| 2012/0098784 A1 | 4/2012 | Kim | |
| 2012/0227259 A1 | 9/2012 | Badaye | |
| 2012/0262419 A1* | 10/2012 | Hershman | G06F 3/044 |
| | | | 345/174 |
| 2012/0306797 A1 | 12/2012 | Misaki | |
| 2013/0100041 A1* | 4/2013 | Golovchenko | G06F 3/044 |
| | | | 345/173 |

* cited by examiner

TOUCH PANEL HAVING ELECTRODES AND ROUTINGS ON SINGLE LAYER This application is a continuation application of application Ser. No. 13/910,492, filed Jun. 5, 2013, which claims the benefit of U.S. provisional application Ser. No. 61/656,535, filed Jun. 7, 2012, the subject matter of which is incorporated herein by reference.

BACKGROUND OF THE INVENTION

Field of the Invention

The invention relates in general to a touch panel, and more particularly to a touch panel with a single conductive layer and capable of sensing multi-touch control.

Description of the Related Art

A touch panel, e.g., a capacitive multi-touch touch panel, by offering a user with a convenient, friendly and intuitive operation interface, prevails in various consumer electronic devices, portable devices and handheld devices, e.g. remote controllers, mobile handsets, digital cameras, video recorders/players, portable pads and touch screens.

A multi-touch touch panel includes multiple driving electrodes and multiple sensing electrodes distributed at a touch control region. The driving electrodes are respectively connected to different drivers, and the sensing electrodes are respectively connected to different sensors. The drivers rapidly and periodically drive the driving electrodes connected thereto in turn. When a position of a user touch is proximate to a particular driven driving electrode and a particular sensing electrode, mutual capacitance between the driving electrode and the sensing electrode changes. According to the position of the driven driving electrode and the position of the sensing electrode where the capacitance change occurs, the position of the user touch can be derived.

In a conventional touch panel, to analyze a touch position, driving electrodes and sensing electrodes are horizontally and vertically placed in a staggered arrangement. As the driving electrodes and the sensing electrodes are respectively formed at two different transparent conductive layers with higher cost and a greater thickness, the prevalence and applications of the touch control operation interface are hindered. Further, since an image displayed by a display panel integrated with the conventional touch panel needs to penetrate through a larger number of conductive layers, display brightness and quality are degraded.

SUMMARY OF THE INVENTION

To mitigate setbacks of a touch panel formed by multiple conductive layers, driving electrodes and sensing electrodes may be disposed at a single conductive layer, with routings and pads, connecting the driving electrodes and sensing electrodes to drivers and sensors, also formed on the same conductive layer. However, the routings and driving electrodes of different drivers as well as the routings and sensing electrodes of different sensors are mutually insulated. Therefore, shapes and arrangements of the sensing electrodes and the driving electrodes as well as directions of the routings all need to be appropriately arranged.

A touch panel is provided by the present invention. The touch panel includes a first electrode, a first routing, a second electrode, two second routings and a third electrode, all of which are formed on a single conductive layer. The first routing is connected to the first electrode. The second electrode includes two second sub-electrodes respectively disposed at two sides of the first routing, and is insulated from the first routing. The two second routings are respectively connected to the two second sub-electrodes to mutually connect the two second sub-electrodes. The third electrode is insulated from the first electrode and the second electrode. Two among of the first, second and third electrodes are respectively connected to a driver and a sensor.

The two second routings respectively extend along the two sides of the first routing. The touch panel further includes a first pad and a second pad, both of which are formed on the conductive layer. Two ends of the first routing are respectively connected to the first pad and the first electrode, and the two second routings connect the second pad to the two second sub-electrodes along the two sides of the first routing, respectively. The first electrode includes two first sub-electrodes and one other first routing is provided. The two first routings are respectively connected to the two first sub-electrodes. The two second sub-electrodes are spaced by an insulating first gap, and the first routing extends along the first gap.

Preferably, the touch panel further includes a fourth electrode, which is also formed on the foregoing conductive layer. The second electrode is located between the first electrode and the fourth electrode. The fourth electrode includes two fourth sub-electrodes spaced by a second gap, and the first routing and the two second routings extend along the second gap.

The touch panel comprises a touch control region and a pad region. The electrodes of the touch panel are formed at the touch control region, and the pads are formed at the pad region. The routings, e.g., the foregoing first and second routings, of all electrodes pass through a same side of the touch control region to extend to the pad region to connect the electrodes to the pads. Alternatively, the routings of particular electrodes and the routings of some other electrodes respectively pass through two different sides of the touch control region to extend to the pad region. Alternatively, in addition to the first to third electrodes, the touch panel further includes a fourth electrode and a fourth routing. The first electrode is located between the second electrode and the fourth electrode. The first routing passes through a first side of the touch control region to extend to the pad region, and the fourth routing passes through a second side of the touch control region to extend to the pad region, with the first and second sides of the touch control region being opposite sides. When the first routing passes through the first side along a first direction, the fourth routing passes through the second side along an opposite direction to the first direction.

Preferably, the first electrode and the third electrode may be a pair of tessellation electrodes, and/or one of the second sub-electrodes and the third electrode may be a pair of tessellation electrodes. The tessellation electrode pair includes a first tessellation electrode and a second tessellation electrode. A branch exists between two first points at a first side of the first tessellation electrode, and has a perimeter between the two first points greater than a linear distance between the two first points. A dent is provided between two second points at a second side of the second tessellation electrode, and has a perimeter between the two second points greater than a linear distance between the two second points. The branch intervenes with the dent with a gap in between.

The two second routings are respectively located at two different sides of the first electrode, and extend along the two sides of the first electrodes. For another example, in addition to the first to third electrodes, the touch panel may further include a fourth electrode. The first electrode is located between the second electrode and the fourth electrode, and the fourth electrode includes two fourth sub-electrodes respectively connected to the two second routings.

Preferably, the pad region is formed by multiple staggered pads at the foregoing conductive layer. The pads include a first pad and a second pad. The first pad is connected to the first electrode via the first routing, and the second pad is connected to the two second sub-electrodes via the two second routings. That is, the two second sub-electrodes disposed at the two sides of the first routing may respectively be connected to the same second pad via the two second routings at the two sides of the first routing. Similarly, when the third electrode and a fourth electrode are respectively located at two different sides of the first routing, the third electrode and the fourth electrode may respectively be connected to the same third pad via a third routing and a fourth routing. The third and fourth routings are located at the same side of the first routing, and the fourth routing and the fourth electrode are located at the other side of the first routing.

Preferably, the touch panel includes one or multiple floating dummy electrodes formed at the conductive layer. The floating dummy electrodes are located between two among the first, second and third electrodes and insulated from the same.

A touch panel is further provided. The touch panel includes a first electrode and a second electrode, which are formed at a single conductive layer and respectively connected to a driver and a sensor. The first electrode has a first border including a first jigsaw section extended between two first points at the first border. The second electrode has a second border including a second jigsaw section extending between two second points at the second border. The second jigsaw section protrudes at a connecting line between the two first points along the conductive layer, and the first jigsaw section also protrudes between the two second points.

Preferably, the touch panel further includes one or multiple floating dummy electrodes. The dummy electrodes are formed at the foregoing conductive layer, located between the first and second electrodes, and insulated from the same. The border of the second electrode further includes a fourth jigsaw section. The touch panel further includes a third electrode formed at the foregoing conductive layer. The third electrode has a third border including a third jigsaw section extending between two third points at the third border. The fourth jigsaw section protrudes between two third points.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
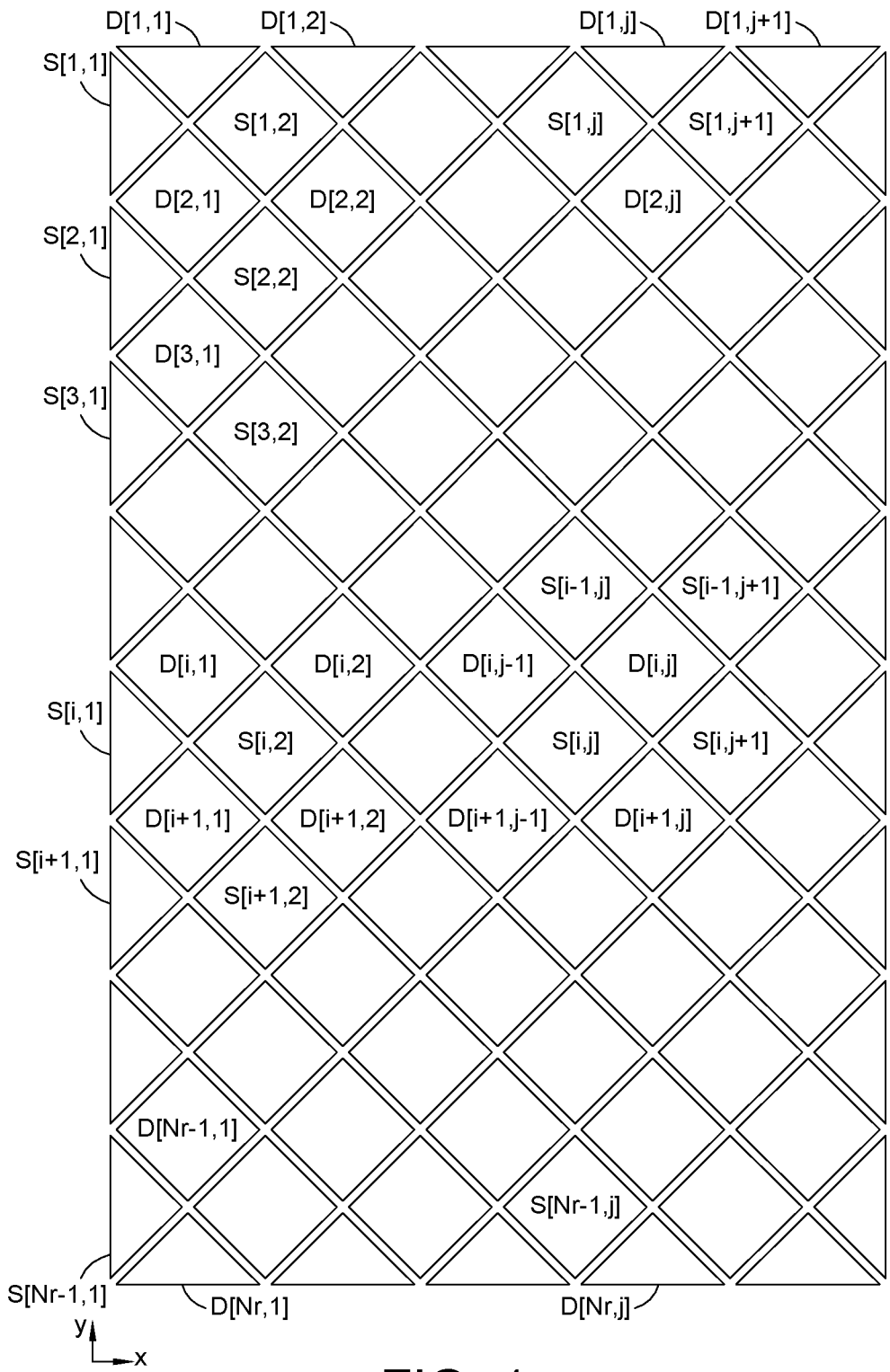
FIG. 1 shows an electrode arrangement according to an embodiment of the present invention.

FIG. 1 shows a schematic diagram of an electrode arrangement according to an embodiment of the present invention. The electrode arrangement includes a plurality of electrodes $D[1, 1]$, $D[1, 2]$, $D[2, 1]$ and $D[i, j]$ to $D[Nr, j]$ as driving electrodes, and a plurality of electrodes $S[1, 1]$, $S[1, 2]$, $S[2, 1]$ and $S[i, j]$ to $S[Nr-1, j]$ as sensing electrodes, where Nr is an integer. The electrodes $D[i, j]$ and the electrodes $S[i, j]$ are in a grid arrangement in a mutually insulated manner at a single conductive layer. Borders of the electrode $S[i, j]$ are spaced by an insulation gap from neighboring electrodes $D[i, j-1]$, $D[i, j]$, $D[i+1, j]$ and $D[i+1, j-1]$. Similarly, borders of the electrode $D[i, j]$ are spaced by an insulation gap from neighboring electrodes $S[i-1, j]$, $S[i-1, j+1]$, $S[i, j+1]$ and $S[i, j]$.

To analyze a touch position, at least one of the four neighboring driving electrodes $D[i, j]$ of each of the sensing electrodes $S[i, j]$ is connected to different drivers. Assume that a particular electrode $S[i1, j1]$ is neighboring to the electrodes $D[i1, j1-1]$, $D[i1, j1]$, $D[i1+1, j1]$ and $D[i1+1, j1-1]$, and another electrode $S[i2, j2]$ is neighboring to the electrodes $D[i2, j2-1]$, $D[i2, j2]$, $D[i2+1, j2]$ and $D[i2+1, j2-1]$, where i1 is not equal to i2, and/or j1 is not equal to j2. One of the electrodes $D[i1, j1-1]$, $D[i1, j1]$, $D[i1+1, j1]$ and $D[i1+1, j1-1]$ and one of the electrodes $D[i2, j2-1]$, $D[i2, j2]$, $D[i2+1, j2]$ and $D[i2+1, j2-1]$ may connect to two different drivers, i.e., two drivers that are not simultaneously driven. Based on the above principle, the drivers connected to the electrodes $D[i, j]$ and the drivers connected to the electrodes $S[i, j]$ are allotted.

In an exemplary embodiment of a driving-sensing arrangement, the electrode $D[i, j]$ may be connected to a driver $DU[i+Nr*mod(j+1, 2)]$ (not shown, where $mod(p, d)$ is a remainder of dividing p by d), the electrode $S[i, j]$ may be connected to a sensor $SU[Ns*mod(i+1, 2)+mod(j-1, Ns)+1]$, where Ns is an integral constant. Under the above arrangement, the electrodes $D[1, 1]$ to $D[Nr, 1]$ are respectively connected to an Nr number of different drivers $DU[1]$ to $DU[Nr]$, the electrodes $D[1, 2]$ to $D[Nr, 2]$ are respectively connected to another Nr number of different drivers $DU[Nr+1]$ to $D[2*Nr]$, the electrodes $D[1, 3]$ to $D[Nr, 3]$ are also respectively connected to the drivers $DU[1]$ to $DU[Nr]$ as the electrodes $D[1, 1]$ and $D[Nr, 1]$, the electrodes $D[1, 4]$ to $D[Nr, 4]$ are also respectively connected to the drivers $DU[Nr+1]$ to $D[2*Nr]$ as the electrodes $D[1, 2]$ and $D[Nr, 2]$, and so forth. The electrodes $S[1, 1]$ to $S[1, Ns]$ are respectively connected to the sensors $SU[1]$ to $SU[Ns]$, the electrodes $S[1, Ns+1]$ to $S[1, 2*Ns]$ are also respectively connected to the sensors SU[1] to SU[Ns], and so forth. The electrodes S[2, 1] to S[2, Ns] are respectively connected to the sensors SU[Ns+1] to SU[2*Ns], the electrodes S[3, 1] to S[3, Ns] are also respectively connected to the sensors SU[1] to SU[Ns], and so forth.

The driving-sensing arrangement of the driving electrodes/drivers and the sensing electrodes/sensors is not limited to the above exemplary driving-sensing arrangement—many other driving-sensing arrangements for achieving position analysis of a touch position are available. For example, the electrode D[i, j] may be connected to the driver DU[i+Nr*mod(j+1, 2)], and the electrode S[i, j] may be connected to the sensor SU[mod(i, 2)*(mod(j−1, Ns)+1)+mod(i+1, 2)*(2*Ns−mod(−1, Ns))]. For example, the electrodes S[1, 1] to S[1, Ns] are respectively connected to the sensors SU[1] to SU[Ns], and the electrodes S[2, 1] to S[2, Ns] are respectively connected to the sensors SU[2*Ns] to SU[Ns+1]; the electrodes S[3, 1] to S[3, Ns] are also connected to the sensors SU[1] to SU[Ns], and the electrodes S[4, 1] to [4, Ns] are again connected to the sensors SU[2*Ns] to SU[Ns+1].

In a driving-sensing arrangement of an alternative exemplary embodiment, the electrode D[i, j] may be connected to the driver DU[i], and the electrode S[i, j] may be connected to the sensor SU[j]. That is, the electrodes D[i, j1] and D[i, j2] at a same row but different columns are respectively connected to the same driver DU[i], and the electrodes D[i1, j] and D[i2, j] at a same column but different rows are respectively connected to different drivers DU[i1] and DU[i2]. In contrast, the electrodes S[i, j1] and S[i, j2] at a same row but different columns are respectively connected to different sensors SU[j1] and SU[j2], and the electrodes S[i1, j] and S[i2, j] at a same column but different rows are connected to the same sensor SU[j].

In a driving-sensing arrangement of another exemplary embodiment, the electrodes S[i, j] is connected to the sensor SU[j], the electrode D[i, j] is connected to the driver DU[mod(j, 2)*i+mod(j−1, 2)*(Nr−i+1)]. That is, the electrodes D[1, j], D[2, j] to D[Nr, j] at odd columns are respectively connected to the drivers DU[1, j], DU[2, j] to DU[Nr, j]; the electrodes D[1, j], D[2, j] to D[Nr, j] at even columns are respectively connected to the drivers DU[Nr, j], DU[Nr−1, j] to DU[1, j].

Figure 2:
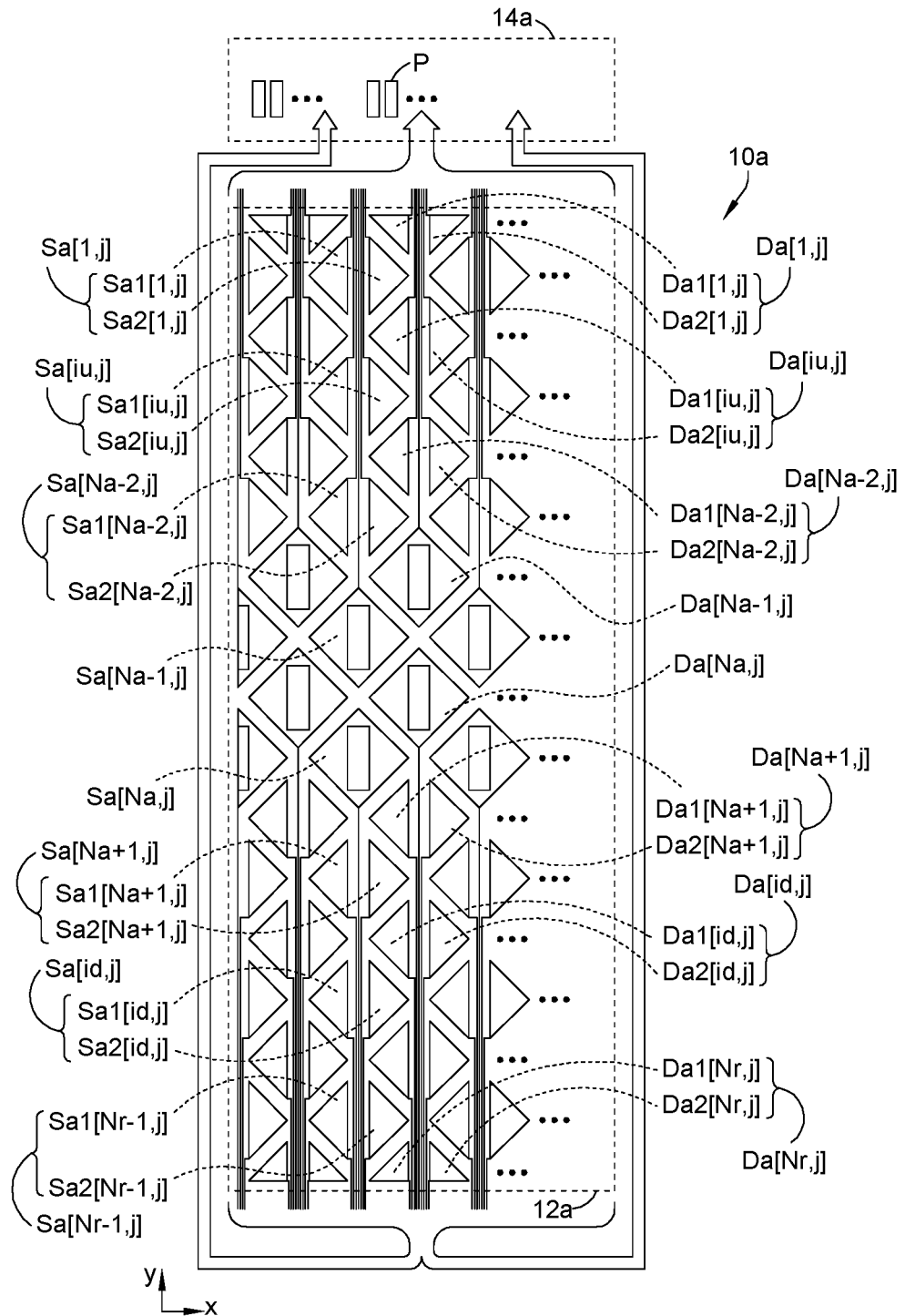
FIG. 2 and FIG. 3 show a touch panel according to an embodiment of the present invention.

FIG. 2 shows a touch panel 10a substantially implementing the electrode layout and arrangement in FIG. 1 according to an embodiment of the present invention. The touch panel 10a includes a touch control region 12a and a pad region 14a. The touch control region 12a includes electrodes Da[1, j] to Da[Nr, j] and electrodes Sa[1, j] to Sa[Nr−1, j], which are all disposed at a single conductive layer and respectively serve as the electrodes D[1, j] to D[Nr, j] and the electrodes S[1, j] to S[Nr−1, j] in FIG. 1. In the touch panel 12a, each electrode Sa[iu, j] of the electrodes Sa[1, j] to Sa[Na−2, j] includes two electrodes Sa1[iu, j] and Sa2[iu, j], where Na is a value between 1 and Nr. The electrodes Sa1[iu, j] and Sa2[iu, j] may be regarded as two sub-electrodes of the electrode Sa[iu, j]. Each electrode Sa[id, j] of the electrodes Sa[Na+1, j] to Sa[Nr−1, j] comprises two electrodes Sa1[id, j] and Sa2[id, j]. Similarly, each electrode Da[iu, j] of the electrodes Da[1, j] to Da[Na−2, j] comprises two electrodes Da1[iu, j] and Da2[iu, j], and each electrode Da[id, j] of the electrodes Da[Na+1, j] to Da[Nr, j] comprises two electrodes Da1[id, j] and Da2[id, j].

Figure 3:
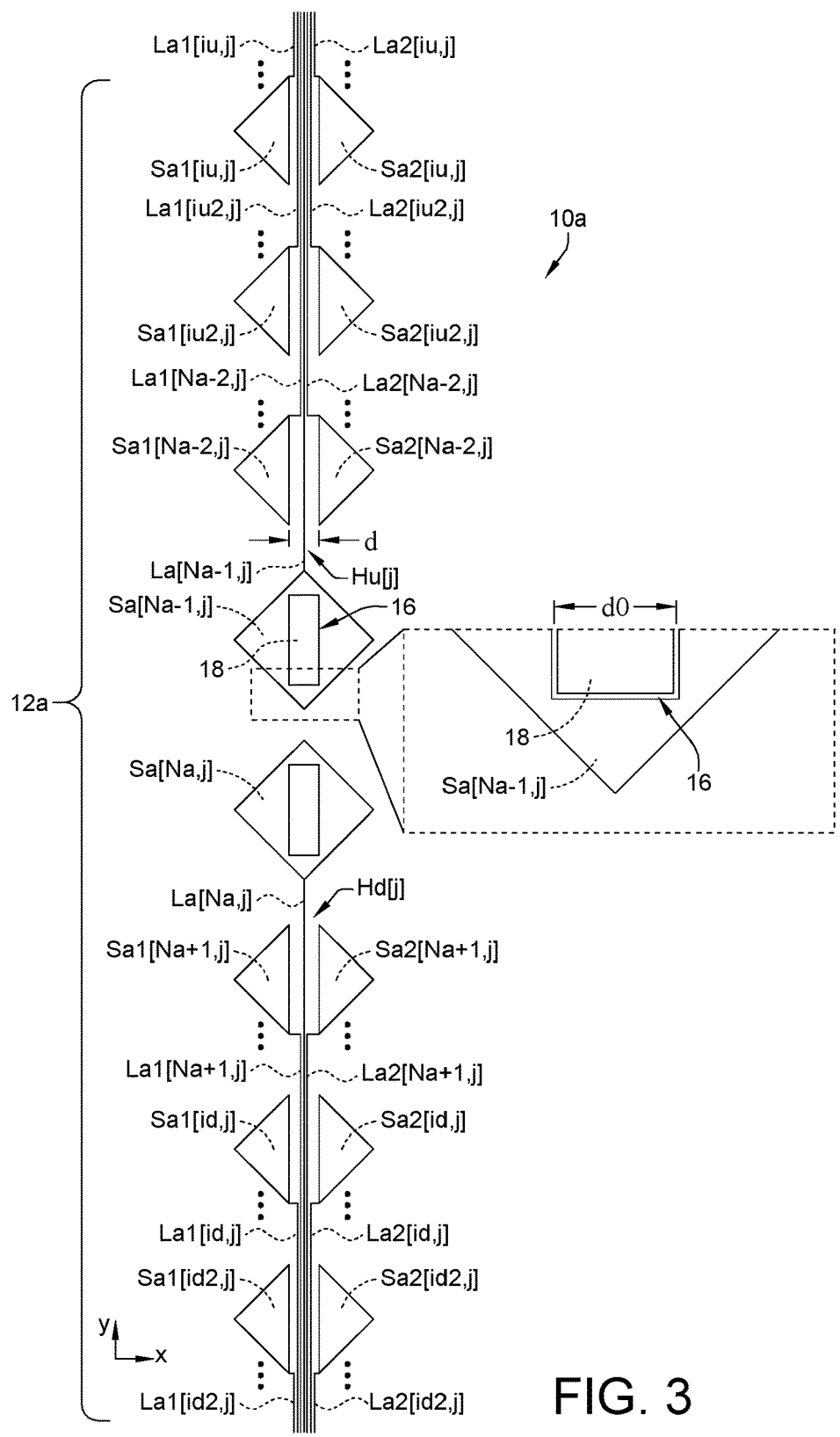

The two electrodes Sa1[iu, j] and Sa2[iu, j] may be regarded as two left and right halves of the electrode Sa[iu, j], and are spaced by an insulation gap extending along the y-axis to accommodate a routing. The electrodes Sa1[id, j] and Sa2[id, j] are spaced by a routable gap extending along the y-axis. Similarly, the electrodes Da1[iu, j] and Da2[iu, j] are spaced by an insulation gap extending along the y-axis to accommodate a routing, and the electrodes Da1[id, j] and Da2[id, j] are also spaced by a routable gap extending along the y-axis. In continuation of the embodiment in FIG. 2, FIG. 3 shows directions of the routings of the electrodes among the electrodes Sa[1, j] to Sa[Nr−1, j]. The electrodes Sa1[iu, j] and Sa2[iu, j] and the electrodes Sa1[iu2, j] and Sa2[iu2, j] may be two arbitrary pairs of electrodes among the electrodes Sa1[1, j] and Sa2[1, j] to the electrodes Sa1[Na−2, j] and Sa2[Na−2, j], and iu<iu2<(Na−1). The gap between the electrodes Sa1[iu, j] and Sa2[iu, j] and the gap between the electrodes Sa1[iu2, j] and Sa2[iu2, j] may extend along the y-axis to form a channel Hu[j] with a width in a distance d with respect to the x-axis. The electrode Sa[Na−1, j] is connected to a routing La[Na−1, j]. The routing La[Na−1, j] upwardly extends along the positive y-axis, and passes through an upper side of the touch region 12a to enter the pad region 14a (FIG. 2). In other words, the electrodes Sa1[iu, j] and Sa2[iu, j] are respectively disposed at left and right sides of the routing La[Na−1, j].

The touch region 12a further includes routings La1[iu, j], La1[iu2, j] to La1[Na−2, j] and routings La2[iu, j], La2[iu2, j] to La2[Na−2, j], which respectively connect the electrodes Sa1[iu, j], Sa1[iu2, j] to Sa1[Na−2, j] to the electrodes Sa2[iu, j], Sa[iu2, j] to Sa2[Na−2, j]. Since the electrodes Sa1[Na−2, j] and Sa2[Na−2, j] are respectively located at the two sides of the routing La[Na−1, j], the routings La1[Na−2, j] and La2[Na−2, j] also respectively upwardly extend (i.e., towards the positive y direction) at the left and right sides of the routing La[Na−1, j] along the channel Hu[j], and pass through the upper side of the touch control region 12a to enter the pad region 14a. In the pad region 14a, the routings La1[Na−2, j] and La2[Na−2, j] may be connected, in a way that the electrodes Sa1[Na−2, j] and Sa2[Na−2, j] are connected to form the same electrode Sa[Na−2, j] (FIG. 2).

Positions of y coordinates of the electrodes Sa1[iu2, j] and Sa2[iu2, j] are higher than those of the electrodes Sa1[Na−1, j] and Sa2[Na−1, j], and so the routings La1[iu2, j] and La2[iu2, j] of the electrodes Sa1[iu2, j] and Sa2[iu2, j] upwardly extend at the left and right sides of the routings La1[Na−2, j] and La2[Na−2, j] along the channel Hu[j], and pass through the upper side of the touch control region 12a to enter the pad region 14a and become mutually connected. Similarly, positions of y coordinates the electrodes Sa1[iu, j] and Sa2[iu, j] are higher than those of the electrodes Sa1[iu2, j] and Sa2[iu2, j], and so the routings La1[iu, j] and La2[iu, j] of the electrodes Sa1[iu, j] and Sa2[iu, j] upwardly extend at the left and right sides of the routings La1[iu2, j] and La2[iu2, j] along the channel Hu[j], and pass through the upper side of the touch control region 12a to enter the pad region 14a and become mutually connected. In other words, for the electrodes Sa[1, j] to Sa[Na−1, j] having routings that extend upwards, the routings connected to these electrodes are located farther from a center of the channel Hu[j] as the positions of y coordinates of these electrodes get higher. With the above routing layout, the routings are kept free from intersecting one another in cross-bridge connections, and can thus be formed at a single conductive layer with the electrodes.

In FIG. 3, with reference to FIG. 2, the electrodes Sa1[id, j] and Sa2[id, j] and the electrodes Sa1[id2, j] and Sa2[id2, j] may be two arbitrary pairs of electrodes among the electrodes Sa1[Na+1, j] and Sa2[Na+2, j] to the electrodes Sa1[Nr−1, j] and Sa2[Nr−1, j], where Na<id<id2. A gap extending along the y-axis is formed between the electrodes Sa1[id, j] and Sa2[id, j] and between the electrodes Sa1[id2, j] and Sa2[id2, j], and the gaps mutually connect along the y-axis to form a channel Hd[j]. The electrode Sa[Na, j] is connected to a routing La[Na, j]. The routing La[Na, j] downwardly extends, i.e. towards the negative y-axis, along the channel Hd[j] to pass through a lower side (FIG. 2) of the touch control region 12a, and upwardly extends along the left or right side of the touch control region 12 outside the touch control region 12a to enter the pad region 14a, as shown in FIG. 2.

The touch control region 12a further includes routings La1[Na+1, j] to La1[id, j] and La1[id2, j], and routings La2[Na+1, j] to La2[id, j] and La2[id2, j], which are respectively connected to the electrodes Sa1[Na+1, j] to Sa1[id, j] and Sa1[id2, j], and the electrodes Sa2[Na+1, j] to Sa2[id, j] and Sa2[id2, j]. Since the electrodes Sa1[Na+1, j] and Sa2[Na+1, j] are located at the left and right sides of the routing La[Na, j], the routings La1[Na+1, j] and La2[Na+1, j] respectively downwardly extend at the two sides of the routing La[Na, j] along the channel Hd[j] to pass through the lower side of the touch control region 12a, and wind along a border of the touch control region 12a, e.g., the left or right side of the touch control region 12a, to reach the pad region 14a. In the pad region 14a, the routings La1[Na+1, j] and La2[Na+1, j] are mutually connected to form the electrode Sa[Na+1, j] (FIG. 2).

When positions y coordinates of the electrodes Sa1[id, j] and Sa2[id, j] are lower than those of the electrodes Sa1[Na+1, j] and Sa2[Na+1, j], the routings La1[id, j] and La2[id, j] of the electrodes Sa1[id, j] and Sa2[id, j] downwardly extend at left and right sides of the routings La1[Na+1, j], La[Na, j] and La2[Na+1, j] along the channel Hd[j], and exits the touch control region 12a from the lower side of the touch control region 12a to wind to the pad region 14a. Similarly, as positions of y coordinates the electrodes Sa1[id2, j] and Sa2[id2, j] are lower than those of the electrodes Sa1[id, j] and Sa2[id, j], the routings La1[id2, j] and La2[id2, j] of the electrodes Sa1[id2, j] and Sa2[id2, j] extend at the left and right sides of the routings La1[id, j] and La2[id, j] in the channel Hd[j] to downwardly extend, pass through the lower side of the touch control region 12a to wind into the pad region 14a, and become mutually connected. In short, for the electrodes Sa[Na, j] to Sa[Nr−1] that downwardly extend, the routings connected to these electrodes are located farther from a center of the channel Hd[j] as the positions of y coordinates of these electrodes get lower. As such, different routings do not intervene with one another.

In the pad region 14a, the routings La1[iu, j] and La2[iu, j], La1[iu2, j] and La2[iu2, j] to La1[Na−2, j], La2[Na−2, j], La[Na−1, j], La[Na, j], La[Na+1, j] and La2[Na+1, j] to La1[id, j] and La2[id, j], and La[id2, j] and La2[id2, j] may respectively connect to the same or different pads P, so as to connect the corresponding electrodes to the same or different sensors, as in the previously discussed driving-sensing arrangement in FIG. 1.

As shown in FIG. 3, an insulation gap 16 may be formed in the electrode Sa[Na−1, j]. Along the x-axis, the gap 16 extends by a distance d0 associated with the distance d to render the shape, area and electromagnetic characteristics of the electrode Sa[Na−1, j] to approximate those of the electrode Sa[Na−2, j]. Similarly, the design of the electrode Sa[Na, j] may also be similar to that of the electrode Sa[Na−1, j]. The routing layout of the electrodes Da[1, j] to Da[Nr, j] may follow that of the electrodes Sa[1, j] to Sa[Nr−1]. In simple, in the embodiment in FIG. 2 and FIG. 3, each of the electrodes at the upper half of the touch control region 12a may be divided into two sub-electrodes, such that the corresponding routings are allowed to pass through and exit from the upper side of the touch control region 12a along the channel between the two sub-electrodes to extend to the pad region 14a. Each of the electrodes at the lower half of the touch control region 12a may also be divided into two sub-electrodes, such that the corresponding routings are allowed to pass through and exit from the lower side of the touch control region 12a along the channel between the two sub-electrodes to wind along the periphery of touch control region 12a to reach the pad region 14a.

Figure 4:
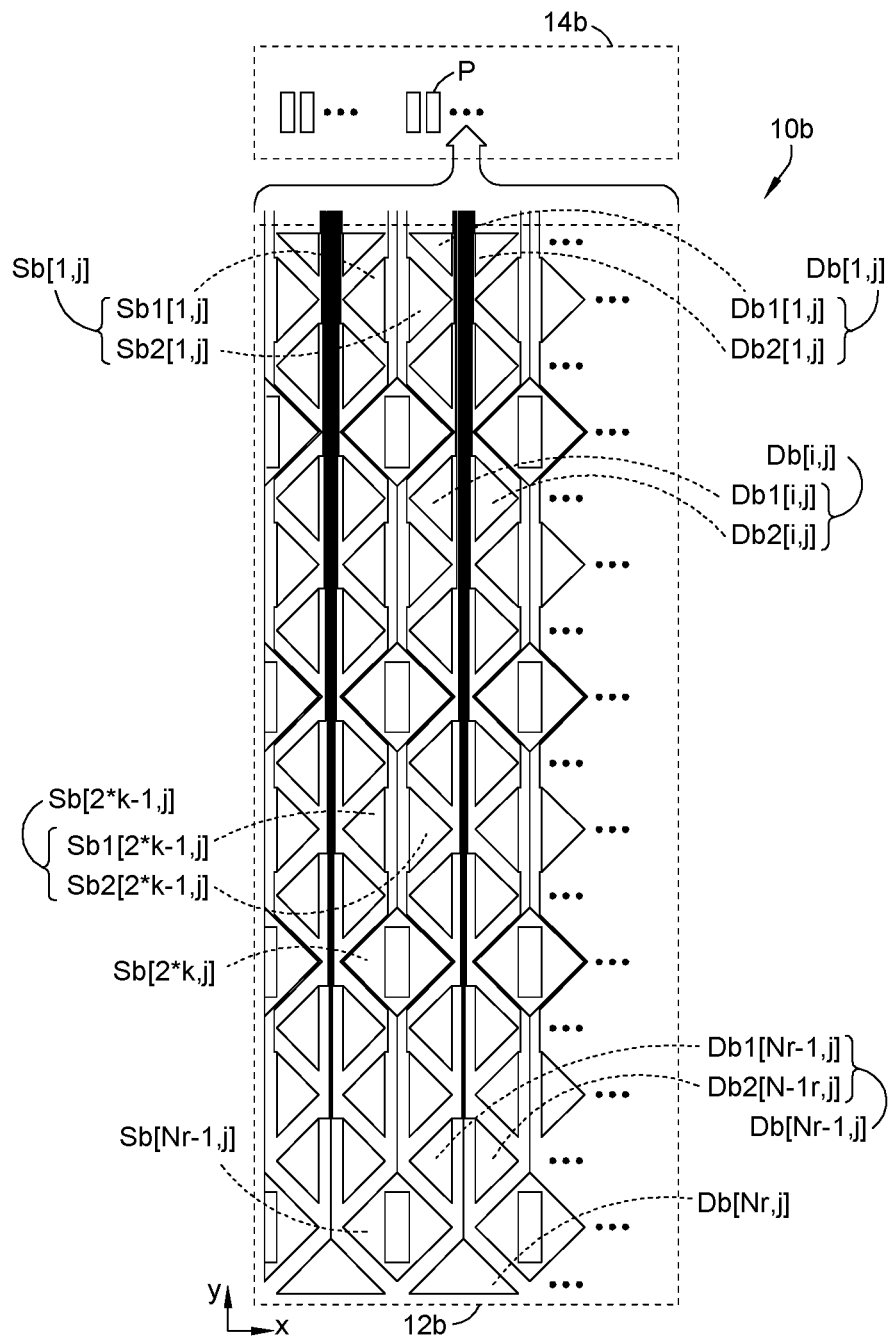
FIG. 4 to FIG. 6 show a touch panel according to an embodiment of the present invention.
Figure 5:
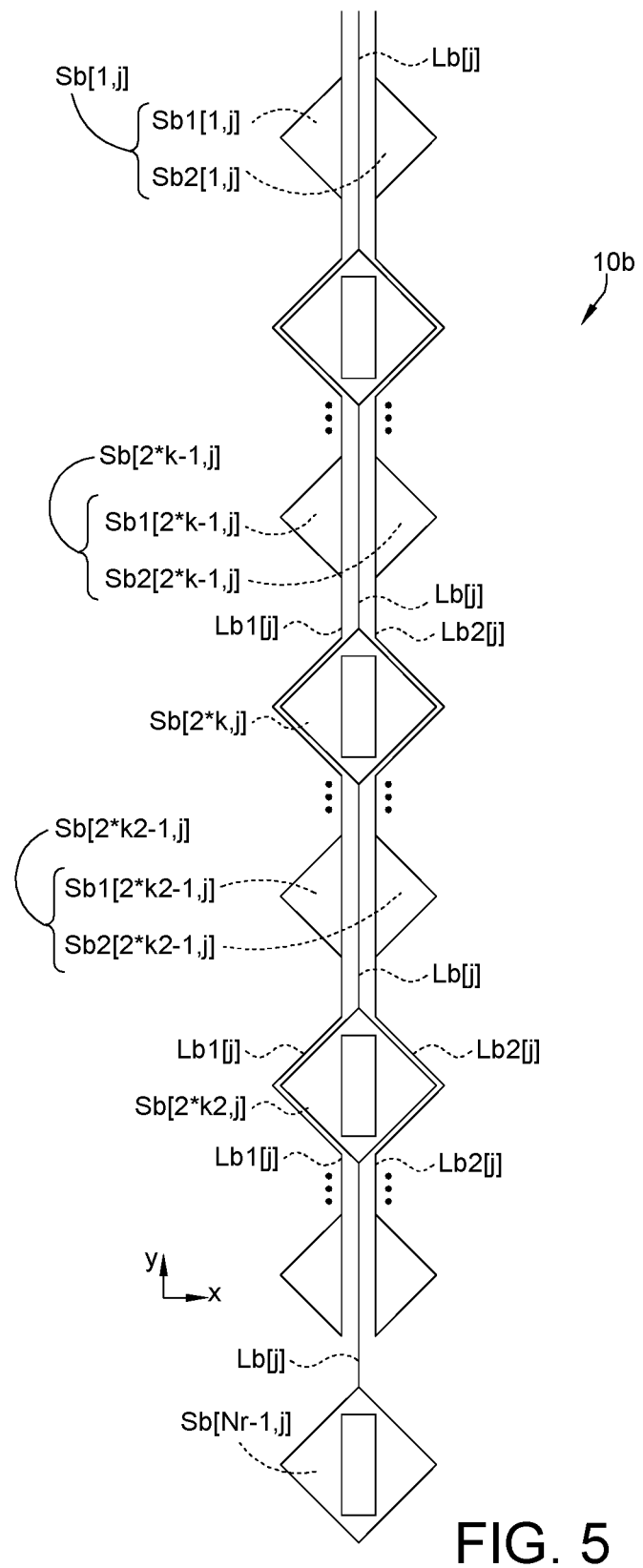
Figure 6:
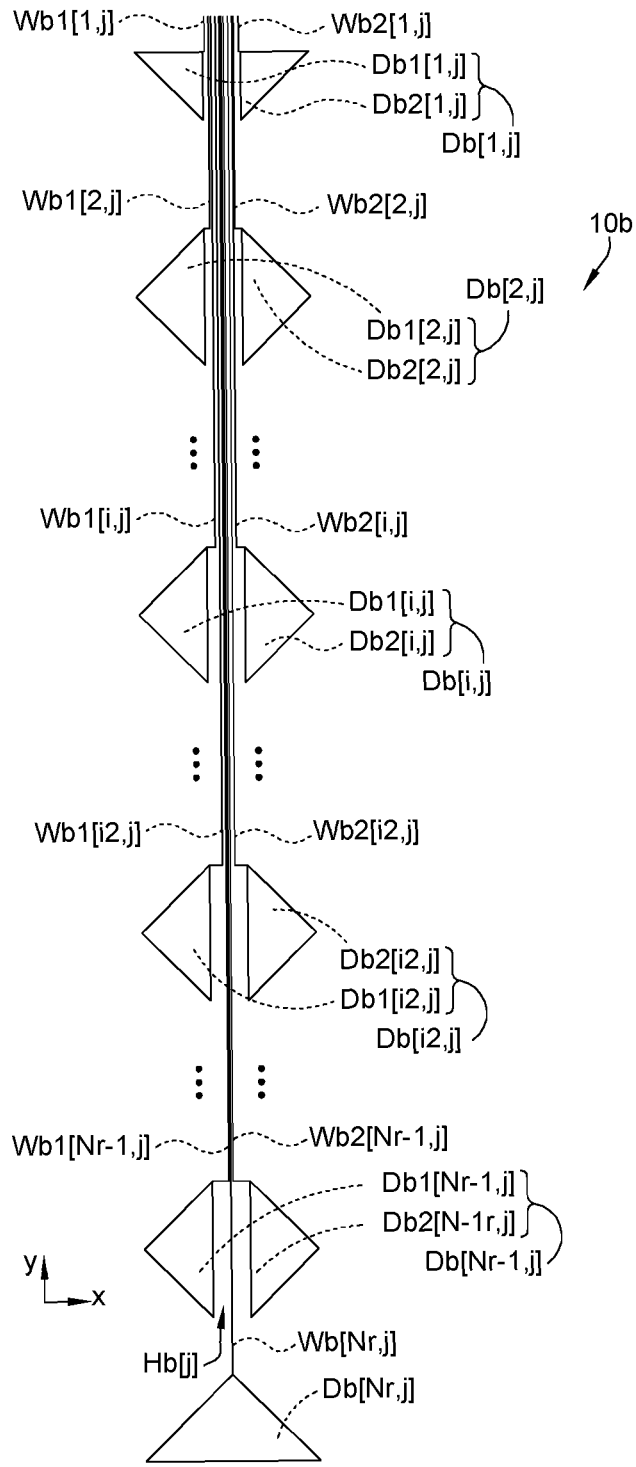

FIGS. 4 to 6 show a touch panel 10b according to an embodiment of the present invention. The touch panel 10b includes a touch control region 12b and a pad region 14b. The touch control region 12b includes electrodes Db[1, j] to Db[Nr, j] and electrodes Sb[1, j] to Sb[Nr−1, j], which are all formed on a single conductive layer and respectively serve as the electrodes D[1, j] to D[Nr, j] and the electrodes S[1, j] to S[Nr−1, j] in FIG. 1.

As previously discussed with reference to FIG. 1, in an embodiment of the sensing-driving arrangement, the electrode S[i, j] may be connected to the sensor SU[Ns*mod(i+1, 2)+mod(j−1, Ns)+1]. That is, when the index i is an odd number (2*k−1), the electrode S[(2*k−1), j] is connected to the sensor SU[mod(j−1, Ns)+1]; when the index i is an even number (2*k), the electrode S[2*k, j] is connected to the sensor SU[mod(j−1, Ns)+1+Ns]. In other words, the electrodes S[1, j], S[3, j], S[5, j] . . . at the odd rows are connected to the same sensor, and the electrodes S[2, j], S[4, j], S[6, j] at the even rows are connected to the same sensor—the touch panel 10b is capable of implementing such embodiment. As shown in FIG. 5, in the touch panel 10b, two arbitrary even-row electrodes Sb[2*k, j] and Sb[2*k2, j] among the electrodes Sb[1, j] to Sb[Nr−j] are connected in series by a routing Lb[j]. The odd-row electrode Sb[2*k2−1, j] is formed by two sub-electrodes Sb1[2*k−1, j] and Sb2[2*k−1, j]. The electrodes Sb1[2*k−1, j] and Sb2[2*k−1, j] are spaced by a gap extending along the y-axis, and the routing Lb[j] passes through the gap. That is to say, the electrodes Sb1[2*k−1, j] and Sb2[2*k−1, j] are respectively located at two sides of the routing Lb[j]. Among the electrodes Sb[1, j] to Sb[Nr−1, j], two arbitrary odd-row electrodes Sb1[2*k−1, j] and Sb1[2*k2−1, j] are connected in series by a routing Lb1[j], and two arbitrary odd-row electrodes Sb2[2*k−1, j] and Sb2[2*k2−1, j] are connected in series by a routing Lb2[j].

As shown in FIG. 5, when passing by an arbitrary odd-row electrode Sb[2*k, j], the routings Lb1[j] and Lb2[j] are located at two different sides of the electrode Sb[2*k, j], and upwardly extend along the electrode Sb[2*k, j] to reach the electrodes Sb1[2*k−1] and Sb2[2*k−1, j]. Between the electrodes Sb[2*k−1] and Sb[2*k], the routings Lb1[j] and Lb2[j] respectively extend along two different sides of the routing Lb[j]. The routings Lb[j], Lb1[j] and Lb2[j] pass through the upper side of the touch control region 12b to extend to the pad region 14b. As such, the even-row electrodes Lb[2*k, j] are allowed to connect to the same pad via the routing Lb[j] to further connect to the same sensor. The routings Lb1[j] and Lb2[j] may be jointly connected to another pad, so that the electrode Sb[2*k−1, j] formed by the connected odd-row electrodes Sb1[2*k−1, j] and Sb2[2*k−1, j] may be connected to another sensor. In an embodiment, an loop-like insulation gap may be defined in the even-row electrode Sb[2*k, j], as shown in the electrode Sa[Na−1, j] in FIG. 3.

As shown in FIGS. 4 to 6, an arbitrary electrode Db[i, j] among the electrodes Db[1, j] to Db[Nr−1, j] is formed by two electrodes Db1[i, j] and Db2[i, j]. The electrodes Db1[i, j] and Db2[i, j] are spaced by a gap extending along the y-axis, and the gap between the electrodes Db1[i, j] and Db2[i, j] to the gap between the electrodes Db1[Nr−1, j] and Db2[Nr−1, j] become connected to form a channel Hb[j] (FIG. 6) extending along the y-axis. The touch panel 10b includes a routing Wb[Nr, j] connected to the electrode Db[Nr, j]. The routing Wb[Nr, j] upwardly extends along the channel Hb[j], and passes through the upper side of the touch control region 12b to extend to the pad region 14b. For the electrode pairs Db1[i, j] and Db2[i, j], the touch panel 10b also provides routings Wb1[i, j] and Wb2[i, j]. The routing Wb1[i, j] is connected to the electrode Db1[i, j], and the routing Wb2[i, j] is connected to the electrode Db2[i, j]. The routings Wb1[i, j] and Wb2[i, j] upwardly extend at the two sides of the routing Wb[Nr, j] along the channel Hb[j], pass through the upper side of the touch control region 12b to extend to the pad region 14b, and become mutually connected in the pad region 14b to connect the electrodes Db1[i, j] and Db2[i, j] into one same electrode Db[i, j]. As shown in FIG. 6, among the electrodes Db[1, j] to Db[Nr−1, j], assuming that one electrode Db[i2, j] (formed by electrodes Db1[i2, j] and Db2[i2, j]) is arranged between the electrodes Db[i, j] and Db[Nr−1, j], the routing Wb1[i2, j] of the electrode Db[i2, j] is clamped between the routings Wb1[i, j] and Wb2[i, j] to upwardly extend along the channel Hb[j], and the other routing Wb2[i2, j] upwardly extends between the routings Wb2[Nr−1, j] and Wb2[i, j] along the channel Hb[j]. In other words, for the electrodes Sa[1, j] to Sa[Na−1, j] having routings that travel upwards, since the routings of the electrodes Db[1, j] to Db[Nr, j] upwardly extend, the routings connected to these electrodes are located farther from a center of the channel Hb[j] as the positions of y coordinates of these electrodes get higher. Thus, the routings are free from mutual intervention, and the routings and electrodes are allowed to be fabricated on a single conductive layer.

Figure 7:
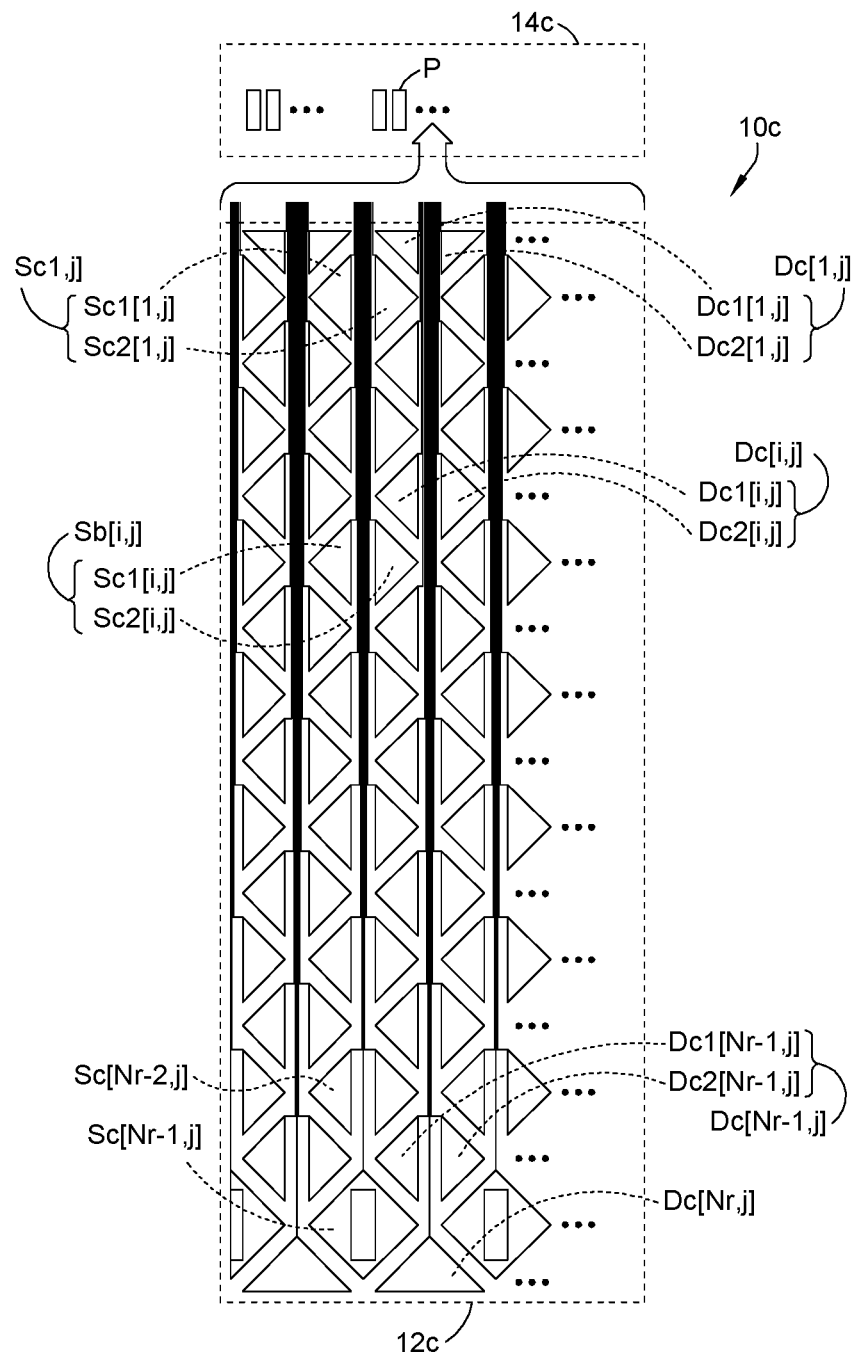
FIG. 7 and FIG. 8 show a touch panel according to an embodiment of the present invention.
Figure 8:
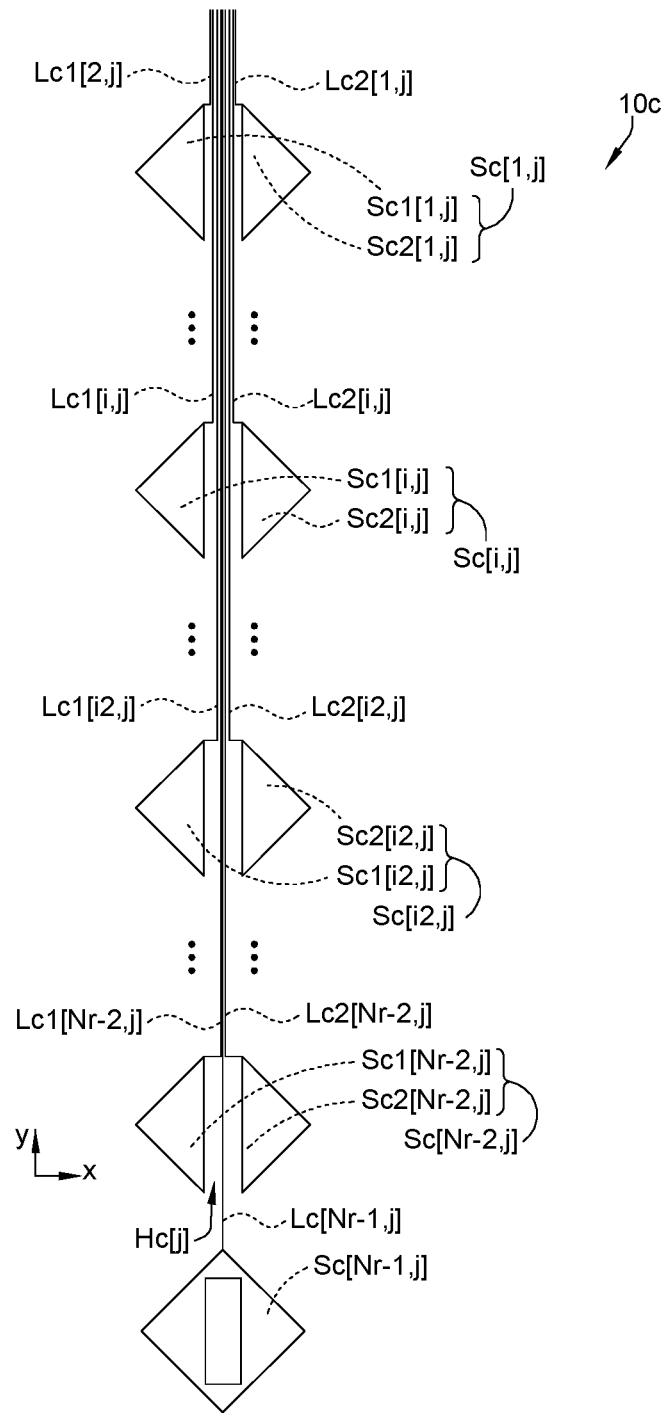

FIGS. 7 and 8 show a touch panel 10c implementing the electrode layout and arrangement in FIG. 1 according to an embodiment of the present invention. The touch panel 10c includes a touch control region 12c and a pad region 14c. The touch control region 12c includes electrodes Dc[1, j] to Dc[Nr, j] and electrodes Sc[1, j] to Sc[Nr−1, j], which are all disposed at a single conductive layer and respectively serve as the electrodes D[1, j] to D[Nr, j] and the electrodes S[1, j] to S[Nr−1, j] in FIG. 1.

In the touch panel 10c, an arbitrary electrode Dc[i, j] among the electrodes Dc[1, j] to Dc[Nr−1, j] is formed by two electrodes Dc1[i, j] and Dc2[i, j] spaced by a gap extending along the y-axis. The gap between the electrodes Dc1[i, j] and Dc2[i, j] is connected with a gap between the electrodes Dc1[Nr−1, j] and Dc2[Nr−1, j], and so the routings of the electrodes Dc[1, j] to Dc[Nr−1, j] may be arranged with reference to FIG. 6. Similarly, an arbitrary electrode Sc[i, j] among the electrodes Sc[1, j] to Sc[Nr−2, j] is formed by two electrodes Sc1[i, j] and Sc2[i, j] spaced by a gap extending along the y-axis. The gap between the electrodes Sc1[i, j] and Sc2[i, j] is connected with a gap between the electrodes Sc1[Nr−2, j] and Sc2[Nr−2, j] to form a channel Hc[j] as shown in FIG. 8.

In the touch panel 10c, the electrode Sc[Nr−1, j] is connected to a routing Lc[Nr−1, j]. The routing Lc[Nr−1, j] upwardly extends along the channel Hc[j], and passes through the upper side of the touch control region 12b to reach the pad region 14c. The electrodes Sc1[i, j] and Sc2[i, j] are respectively connected to the routings Lc1[i, j] and Lc2[i, j]. The routings Lc1[i, j] and Lc2[i, j] upwardly extend at two sides of the routing Lc[Nr−1, j], pass through the upper side of the touch control region 12c to extend to the pad region 14c, and mutually connect in the pad region 14c to connect the electrodes Sc1[i, j] and Sc2[i, j] into one same electrode Sc[i, j]. As shown in FIG. 8, among the electrodes Sc[1, j] and Sc[Nr−2, j], assuming that one electrode Sc[i2, j], comprising two electrodes Sc1[i2, j] and Sc2[i2, j]), is arranged between the electrodes Sc[i, j] and Sc[Nr−1, j], the routing Lc1[i2, j] of the electrode Sc[i2, j] upwardly extends between the routings Lc1[i, j] and Lc1[Nr−1, j] along the channel Hc[j], whereas the other routing Lc2[i2, j] upwardly extends between the routings Lc2[Nr−1, j] and Lc2[i, j] along the channel Hc[j]. As such, different routings are kept free from mutually intersecting.

Figure 9:
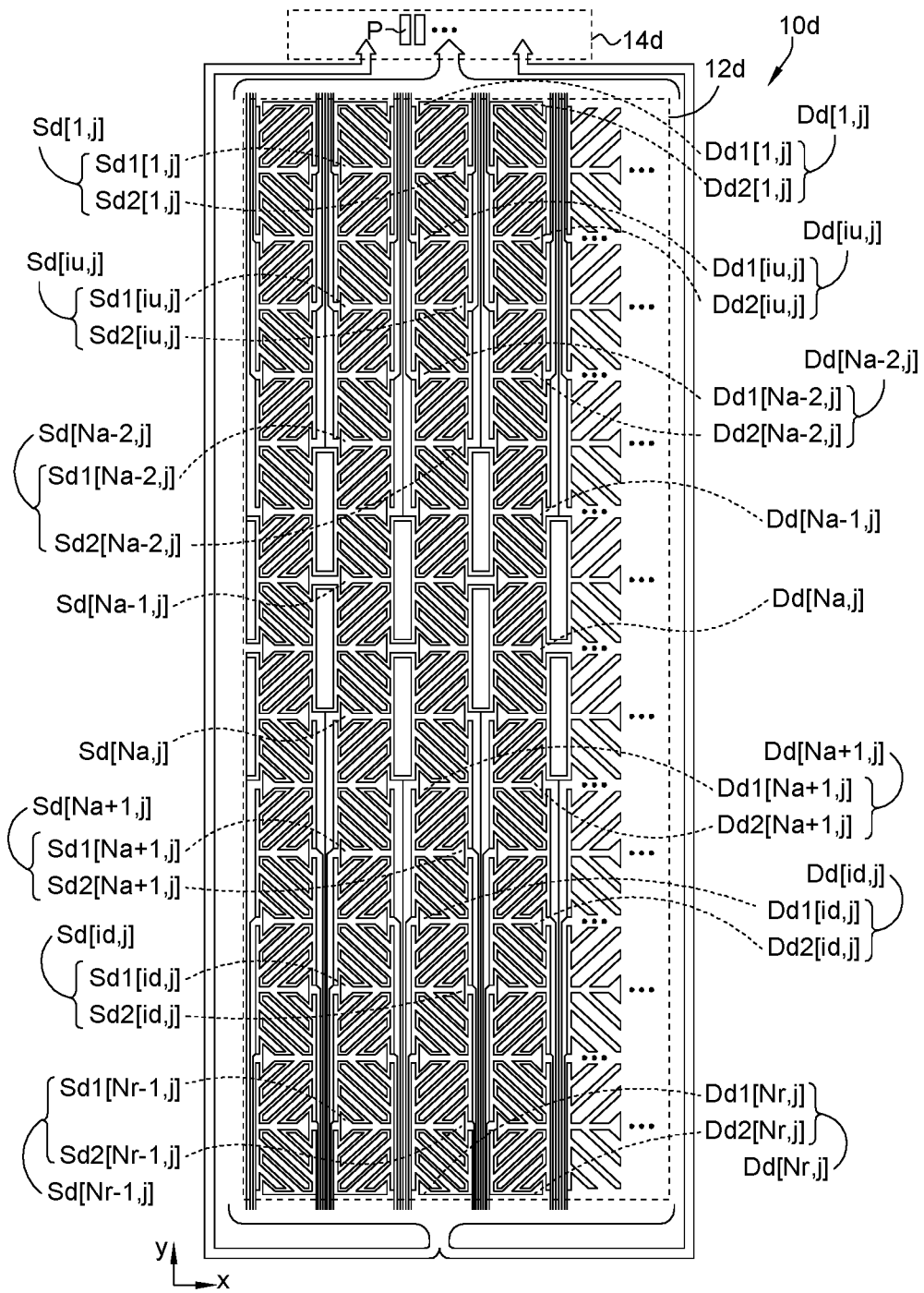
FIG. 9 to FIG. 11 show a touch panel according to an embodiment of the present invention.
Figure 10:
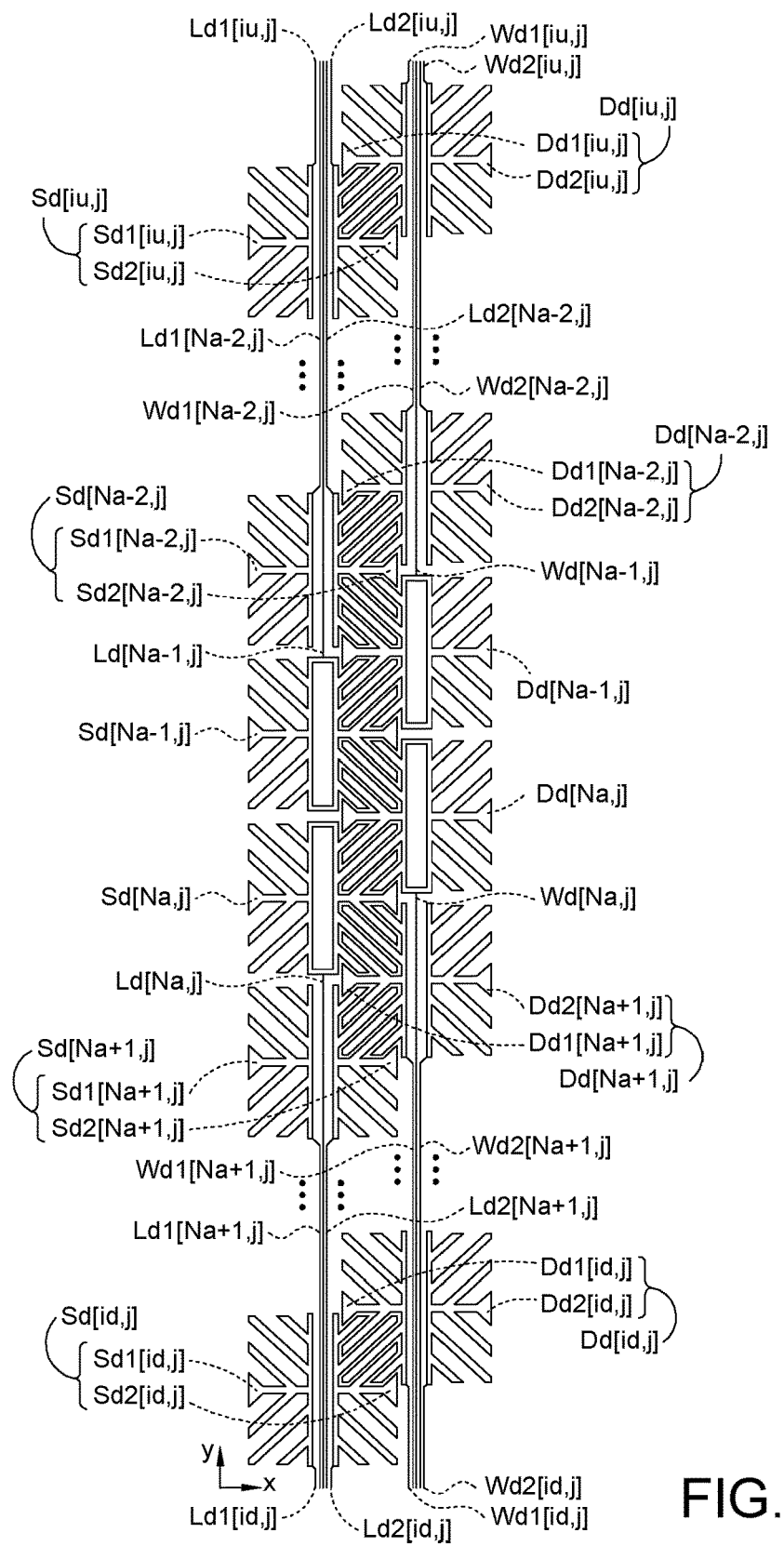
Figure 11:
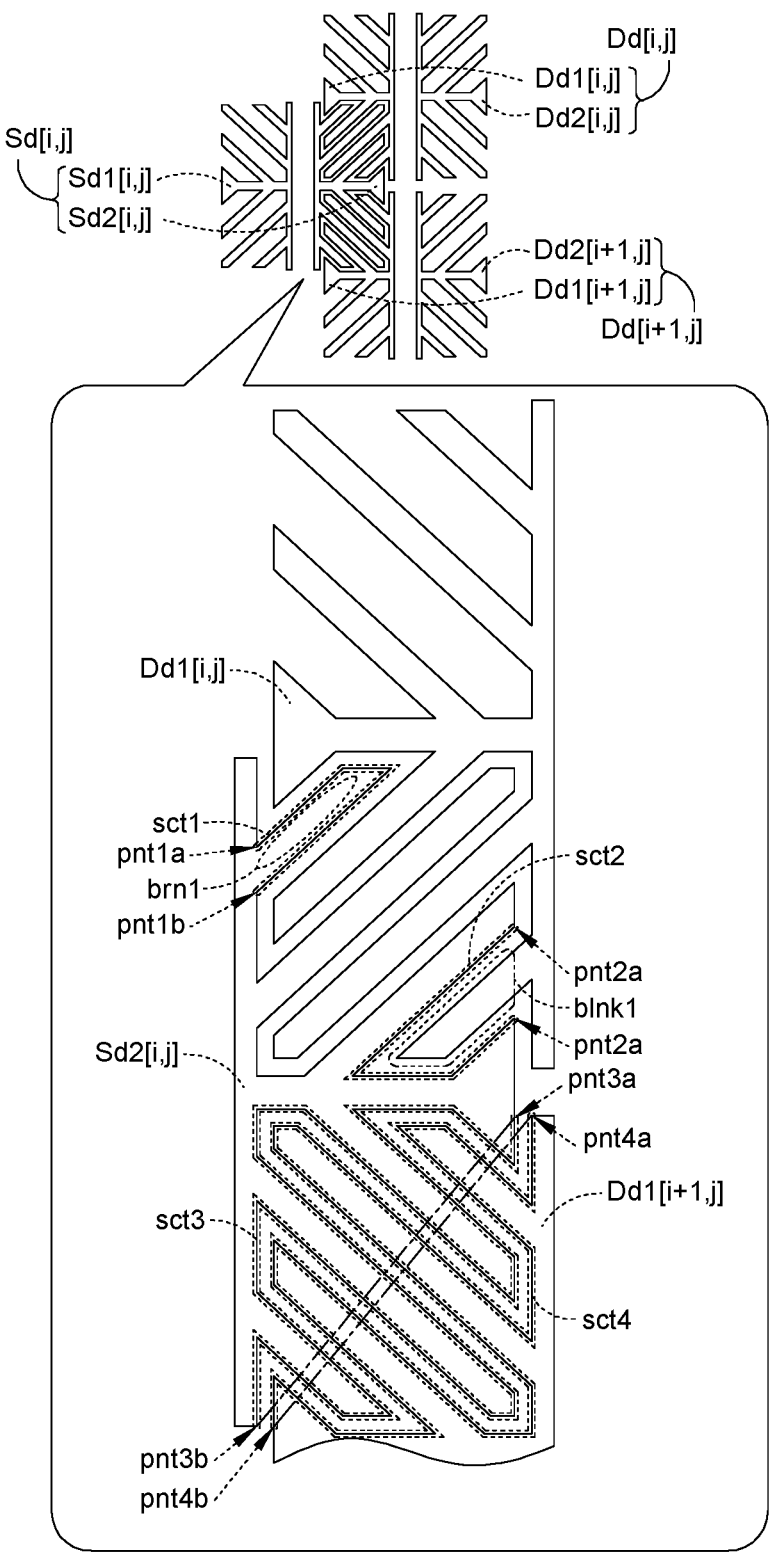

FIGS. 9 to 11 show a touch panel 10d according to an embodiment of the present invention. The touch panel 10d, similar to the touch panel 10a in FIG. 2, includes a touch control region 12d and a pad region 14d. The touch control region 12d includes electrodes Dd[1, j] to Dd[Nr, j] and electrodes Sd[1, j] to Sd[Nr−1, j], which are disposed at a single conductive layer and respectively serve as the electrodes Da[1, j] to Da[Nr, j] and the electrodes Sa[1, j] to Sa[Nr−1, j] in FIG. 1. Similar to the touch panel 10a, in the touch panel 10d, each electrode Sd[iu, j] of the electrodes Sd[1, j] to Sd[Na−2, j] is formed by two electrodes Sd1[iu, j] and Sd[iu, j], and each electrode Sd[id, j] of the electrodes Sd[Na+1, j] to Sd[Nr−1, j] is also formed by two electrodes Sd1[id, j] and Sd2[id, j]. Each electrode Dd[iu, j] of the electrodes Da[1, j] to Dd[Na−2, j] includes two electrodes Dd1[iu, j] and Dd2[iu, j], and each electrode Dd[id, j] of the electrodes Dd[Na+1, j] to Dd[Nr, j] is formed by two electrodes Dd1[id, j] and Dd2[id, j].

As shown in FIG. 10, the electrode Sd[Na−1, j] is connected to a routing Ld[Na−1, j]. The two electrodes Sd1[iu, j] and Sd2[iu, j], regarded as two left and right sub-electrodes of the electrode Sd[iu, j], are spaced by an insulation gap extending along the y-axis, and are respectively connected to two routings Ld1[iu, j] and Ld2[iu, j]. The insulation gaps of the electrodes Sd[1, j] to Sd[Na−2, j] are connected to form a channel that upwardly extends, i.e. towards the positive y direction. The routing Ld[Na−1, j] upwardly extends along the channel and enters the pad region 14d via the upper side of the touch control region 12d. The routings Ld1[iu, j] and Ld2[iu, j] upwardly extend in parallel at the two sides of the routing Ld[Na−1, j], pass through the upper side of the touch control region 12d to enter the pad region 14d, and become mutually connected to connect the electrode Sd1[iu, j] and Sd2[iu, j] as the electrode Sd[iu, j].

Assuming that positions of y coordinates of a pair of electrodes Sd1[iu2, j] and Sd2[iu2, j] (not shown) are lower than those of the electrodes Sd1[iu, j] and Sd2[iu, j] (i.e., iu<iu2<(Na−1)), the routing Ld1[iu2, j] of the electrode Sd1[iu2, j] upwardly extends between the routings Ld1[iu, j] and Ld[Na−1, j], and the routing Ld2[iu2, j] of the electrode Sd2[iu2, j] upwardly extends between the routings Ld[Na−1, j] and Ld2[iu, j]. Under the above routing layout, the routings are kept free from intersecting one another in cross-bridge connections, and can thus be disposed at a single conductive layer with the electrodes.

As shown in FIG. 10, the electrode Sd[Na, j] is connected to a routing Ld[Na, j]. The two electrodes Sd1[id, j] and Sd2[id, j], regarded as two left and right sub-electrodes of the electrode Sd[id, j], are spaced by an insulation gap extending along the y-axis, and are respectively connected to two routings Ld1[id, j] and Ld2[id, j]. The insulation gaps of the electrodes Sd[Na+1, j] to Sd[Nr−1, j] are connected to form a downwardly extending channel (towards the negative y direction). The routing Ld[Na, j] downwardly extends along the channel to exit the lower side of the touch control region 12d, and winds to the pad region 14d along the periphery of the touch control region 12d (FIG. 9). The routings Ld1[id, j[and Ld2[id, j] downwardly extend in parallel at opposite sides of the routing Ld[Na, j], exit the lower side of the touch control region 12d, and wind upwards along the periphery of the touch control region 12 to reach the pad region 14d to become mutually connected, so as to connect the electrodes Sd1[id, j] and Sd2[id, j] to form the electrode Sd[id, j].

Assuming that positions of y coordinates of a pair of electrodes Sd1[id2, j] and Sd2[id2, j] (not shown) are lower than those of the electrodes Sd1[id, j] and Sd2[id, j], i.e., Na<id2<id, the routing Ld1[id2, j] of the electrode Sd1[id2, j] downwardly extends between the routings Ld1[id, j] and Ld[Na, j], and the routing Ld2[id2, j] of the electrode Sd2[id2, j] downwardly extends between the routings Ld[Na, j] and Ld2[id, j]. Thus, the routings La[Na, j], Ld1[Na+1, j] to Ld1[Nr−1, j] and Ld2[Na+1, j] to Ld2[Nr−1, j] are kept free from intersecting one another in crossbridge connections, and can thus be disposed at a single conductive layer with the electrodes.

Similar to the routing layout of the electrodes Sd[1, j] to Sd[Na−1, j] and Sd[Na, j] to Sd[Nr−1, j], the electrode Dd[Na−1, j] is connected to a routing Wd[Na−1, j] (FIG. 10). The two electrodes Dd1[iu, j] and Dd2[iu, j] are spaced by an insulation gap extending along the y-axis, and are respectively connected to two routings Wd1[iu, j] and Wd2[iu, j]. The routing Wd[Na−1, j] upwardly extends to pass through the upper side of the touch control region 12d and enters the pad region 14d. The routings Wd1[iu, j] and Wd2[iu, j] upwardly extend in parallel at two opposite sides of the routing Wd[Na−1, j], pass through the upper side of the touch control region 12d to enter the pad region 14d, and connect the electrodes Dd1[iu, j] and Dd2[iu, j] as the electrode Dd[iu, j].

The electrode Dd[Na, j] is connected to a routing Wd[Na, j]. The two electrodes Dd1[id, j] and Dd2[id, j] are spaced by an insulation gap extending along the y-axis, and are respectively connected to two routings Wd1[id, j] and Wd2[id, j]. The insulation gaps of the electrodes Dd[Na+1, j] to Dd[Nr, j] are connected to form a downwardly extending channel (towards the negative y direction). The routing Ld[Na, j] downwardly extends along the channel to exit the lower side of the touch control region 12d, and winds back to the pad region 14d along the periphery of the touch control region 12d. The routings Wd1[id, j] and Wd2[id, j] downwardly extend in parallel at two opposite sides of the routing Wd[Na, j], exit the touch control region 12d via the lower side of the touch control region 12d, wind back to the pad region 14d along the periphery of the touch control region 14d and become mutually connected, so as to connect the electrodes Dd1[id, j] and Dd2[id, j] to form the electrode Dd[id, j].

FIG. 11 shows an electrode shape exemplified by the neighboring electrodes Sd[i, j], Dd[i, j] and Dd[i+1, j] according to an embodiment. The electrode Sd2[i, j] and the electrode Dd1[i, j] are two tessellation electrodes, and the electrode Sd2[i, j] and the electrode Dd1[i+1, j] are also two tessellation electrodes. In one embodiment, borders of two tessellation electrodes possess jigsaw sections to allow the two tessellation electrodes to mutually intervene with the presence of an insulation gap in between. For example, the border of the electrode Sd2[i, j] includes a jigsaw section sct3, which extends from one point pnt3a to another point pnt3b at the border. To correspond to the jigsaw shape of the jigsaw section sct3, the border of the electrode Dd1[i+1, j] includes a corresponding jigsaw section sct4 extending between two points pnt4a and ptn4b at the border, and intervenes with the jigsaw section sct3 with a gap in between. Contributed by the jigsaw shape of the jigsaw section sct3, the length of the jigsaw section sct3 is greater than a linear distance between the points pnt3a and pnt3b, and the jigsaw section sct4 greatly extends and crosses a connection line between the points pnt3a and pnt3b. Similarly, the length of the jigsaw section sct4 is greater than a linear distance between the points pnt4a and pnt4b, and the jigsaw section sct3 also crosses between the points pnt4a and pnt4b. Since the jigsaw sections increase the corresponding border length between the electrodes Sd2[i, j] and Dd1[i+1, j], mutual coupling between the electrodes Sd2[i, j] and Dd1[i+1, j] is significantly increased to more acutely sense the mutual capacitance change induced by a touch control.

Similarly, the electrodes Sd2[i, j] and Dd1[i, j] are also mutually intervened by jigsaw sections with an insulation gap in between. For example, to form the jigsaw section of the electrode Sd2[i, j], a border of the electrode Sd2[i, j] may include multiple branches, e.g., a branch brn1, with a dent between the branches, e.g., a dent blnk1. At the border of the electrode Sd2[i, j], the branch brn1 protrudes between two points pnt1a and pnt1b, in a way that a perimeter of the branch brn1 between the points pnt1a and pnt1b (i.e., the section sct1) is greater than a linear distance between the points pnt1a and pnt1b. The dent blnk1 is formed between two points pnt2a and pnt2b, in a way that the perimeter of the dent blnk1 between the points pnt2a and pnt2b (i.e., the section sct2) is greater than a linear distance between the points pnt2a and pnt2b. Thus, the branch brn1 of the electrode Sd2 extends into the dent of the electrode Dd1[i, j], and the dent blnk1 of the electrode Sd2[i, j] accommodates the protruding branch of the electrode Dd1[i, j].

Figure 12:
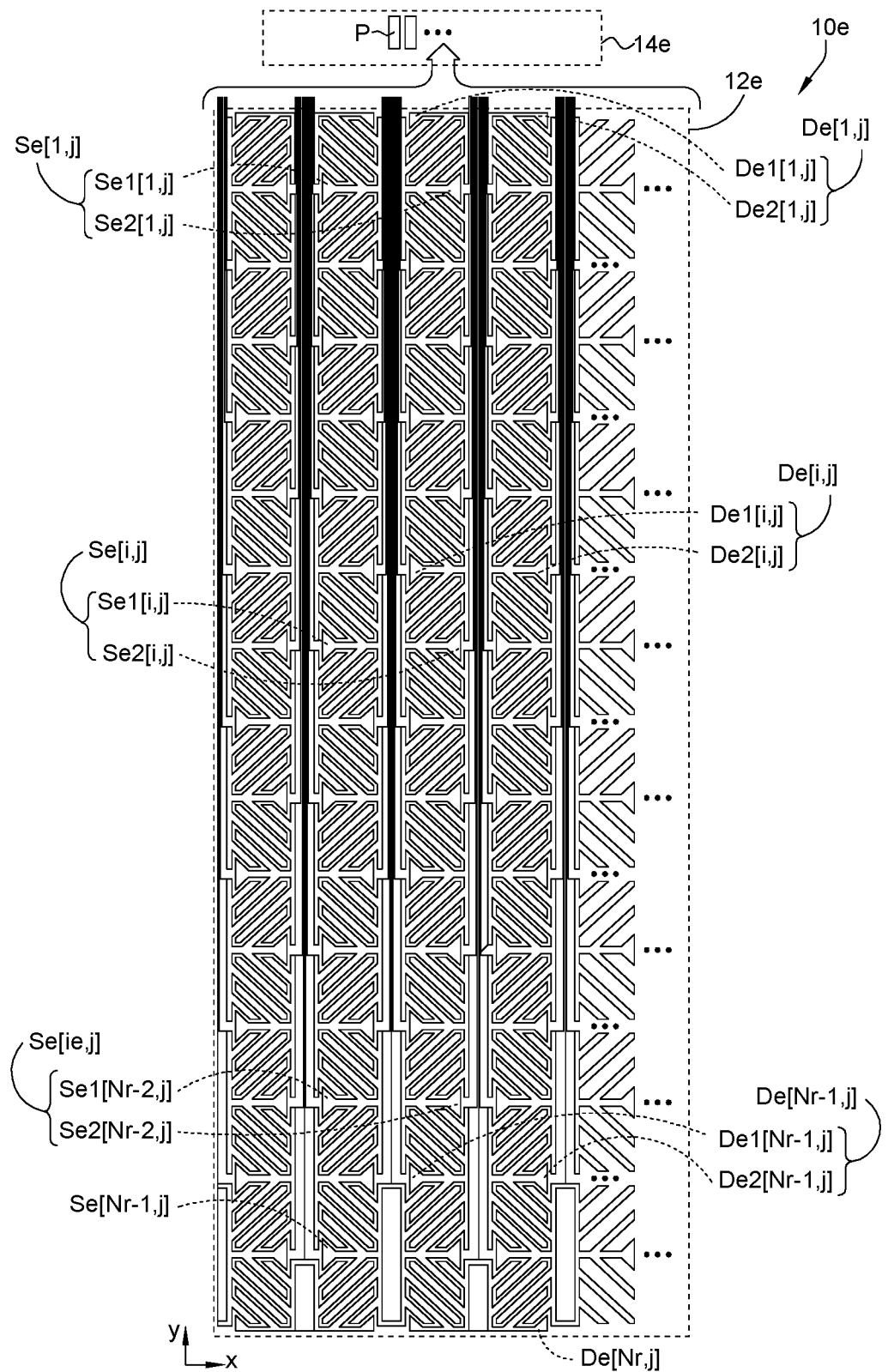
FIG. 12 and FIG. 13 show a touch panel according to an embodiment of the present invention.
Figure 13:
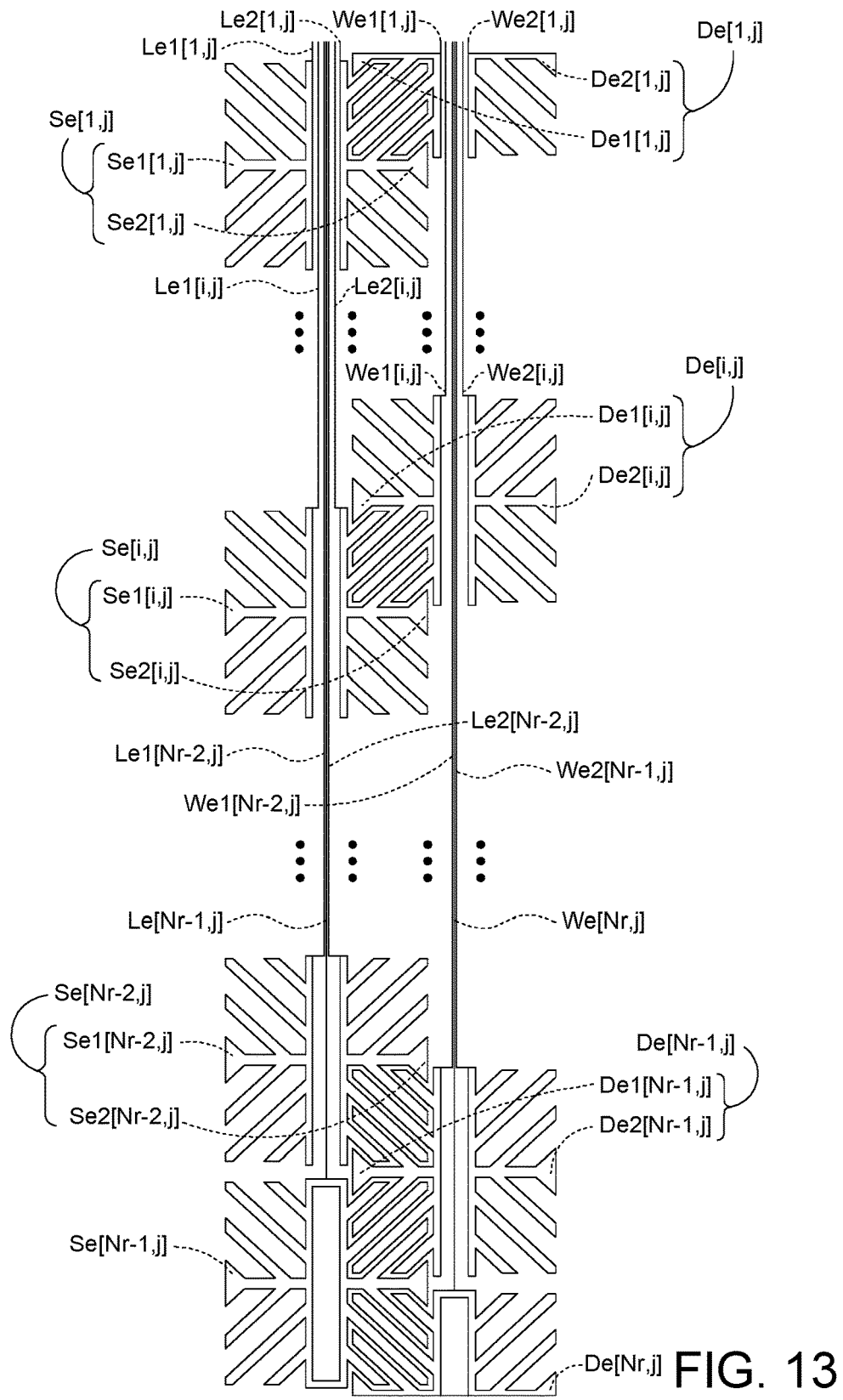

FIGS. 12 and 13 show a touch panel 10e according to an embodiment of the present invention. The touch panel 10e implements the routing layout in the touch panel 10c in FIG. 7 utilizing the electrodes in FIG. 11. The touch panel 10e includes a touch control region 12e and a pad region 14e. The touch control region 12e includes electrodes De[1, j] to De[Nr, j] and electrodes Se[1, j] to Se[Nr−1, j], which are all disposed at a single conductive layer, similar to the electrodes Dc[1, j] to Dc[Nr, j] and the electrodes Sc[1, j] and Sc[Nr−1, j] in FIG. 7. In the touch panel 10e, each electrode Se[i, j] of the electrodes Se[1, j] to Se[Nr−2, j] includes two electrodes Se1[i, j] and Se2[i, j], and each electrode De[i, j] of the electrodes De[1, j] to De[Nr−1, j] comprises two electrodes De1[i, j] and De2[i, j].

As shown in FIG. 13, the electrode Se[Nr−1, j] is connected to a routing Le[Nr−1, j]. Two electrodes Se1[i, j] and Se2[i, j], regarded as two left and right sub-electrodes of the electrode Se[i, j], are spaced by an insulation gap extending along the y-axis, and are respectively connected to two routings Le1[i, j] and Le2[i, j]. The insulation gaps of the electrodes Se[1, j] to Se[Nr−2, j] are connected to form an upwardly extending insulation channel. The routing Le[Nr−1, j] upwardly extends along the channel and enters the pad region 14e via the upper side of the touch control region 12e. The routings Le1[i, j] and Le2[i, j] upwardly extend in parallel at two left and right sides of the routing Le[Nr−1, j], enter the pad region 14e via the upper side of the touch control region 12e as the routing Le[Nr−1, j] and become mutually connected, so as to connect the electrodes Set [i, j] and Se2[i, j] to form the electrode Se[i, j].

Assuming that positions of y coordinates of a pair of electrodes Set [i2, j] and Se2[i2, j] (not shown) are lower than those of the electrodes Set [i, j] and Se2[i, j], i.e., i<i2<(Nr−1) a routing Le1[i2, j] of the electrode Set [i2, j] upwardly extends between the routings Le1[i, j] and Le[Nr−1, j], and a routing Le2[i2, j] of the electrode Se2[i2, j] upwardly extends between the routings Le1[Nr−1, j] and Le2[i, j]. Under the above routing layout, the routings are kept free from intersecting one another in cross-bridge connections, and can thus be disposed at a single conductive layer with the electrodes.

Similarly, the electrode De[Nr, j] is connected to a routing We[Nr, j]. Two electrodes De1[i, j] and De2[i, j], regarded as two left and right sub-electrodes of the electrode De[i, j], are spaced by an insulation gap extending along the y-axis, and are respectively connected to two routings We1[i, j] and We2[i, j]. The insulation gaps of the electrodes De[1, j] to De[Nr−1, j] are connected to form an upwardly extending channel. The routing We[Nr, j] upwardly extends along the channel, and enters the pad region 14e via the upper side of the touch control region 12e. The routings We1[i, j] and We2[i, j] upwardly extend in parallel at two left and right sides of the routing We[Nr, j], pass through the upper side of the touch control region 12e as the routing We[Nr, j] to enter the pad region 14e, and become mutually connected to connect the electrodes De1[i, j] and De2[i, j] to one same electrode De[i, j].

The electrodes Sd[Na−1, j], Sd[Na, j], Dd[Na−1, j] and Dd[Na, j] in FIGS. 9 to 11, and/or the electrodes Se[Nr−1, j] and De[Nr, j] in FIGS. 11 and 12 may also be defined with the loop-like insulation gap 16 as shown in FIG. 3 therein, and the width of the insulation gap 16 with respect to the x-axis may be similar to that of the insulation gap between the two sub-electrodes.

Figure 14:
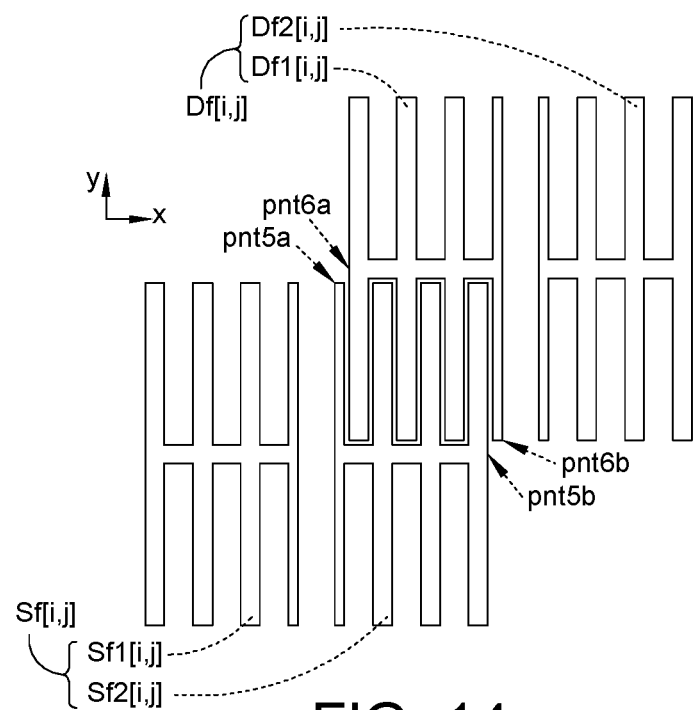
FIG. 14 to FIG. 16 show electrodes according to another embodiment of the present invention.

FIG. 14 shows electrodes Sf[i, j] and Df[i, j] according to an embodiment of the present invention. The electrodes Sf[i, j] and Df[i, j] may replace the electrodes Sd[i, j] and Dd[i, j] of the touch panel 10d (FIGS. 9 to 11), or the electrodes Se[i, j] and De[i, j] of the touch panel 10e (FIGS. 12 and 13). The electrode Sf[i, j] includes two electrodes Sf1[i, j] and Sf2[i, j], and are spaced by an insulation gap along the x-axis that form a y-axis channel for routings. The electrode Df[i, j] includes two electrodes Df1[i, j] and Df2[i, j], and are spaced by an insulation gap that forms a y-axis channel for routings. A jigsaw section is formed between points pnt5a and pnt5b of the electrode Sf2[i, j], and has a length greater than a linear distance between the points pnt5a and pnt5b. Correspondingly, the electrode Df1[i, j] has a jigsaw section formed between points pnt6a and pnt6b, and the jigsaw section has a length greater than a linear distance between the points pnt6a and pnt6b. The jigsaw section between the points pnt6a and pnt6b intervenes with the jigsaw section between the points pnt5a and pnt5b with a gap in between. The jigsaw section between the points pnt5a and pnt5b crosses between the points pnt6a and pnt6b, and the jigsaw section between the points pnt6a and pnt6b crosses between the points pnt5a and pnt5b.

Figure 15:
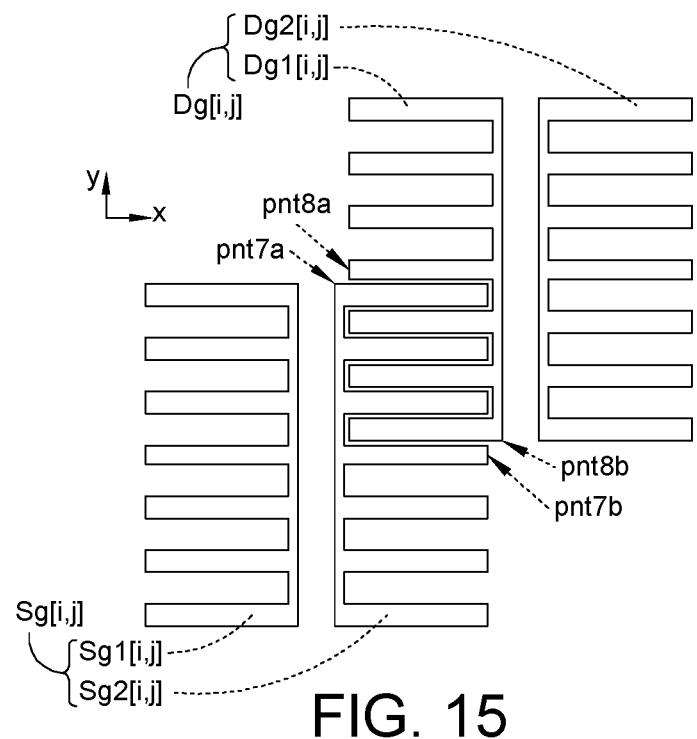

FIG. 15 shows electrodes Sg[i, j] and Dg[i, j] according to an embodiment of the present invention. The electrodes Sg[i, j] and Dg[i, j] may replace the electrodes Sd[i, j] and Dd[i, j] of the touch panel 10d (FIGS. 9 to 11), or the electrodes Se[i, j] and De[i, j] of the touch panel 10e (FIGS. 12 and 13). The electrode Sg[i, j] includes two electrodes Sg1[i, j] and Sg2[i, j] spaced by an insulation gap for forming a y-axis channel. A jigsaw section is formed between points pnt7a and pnt7b of the electrode Sg2[i, j], and has a length greater than a linear distance between the points pnt7a and pnt7b.

Correspondingly, a jigsaw section is formed between points pnt8a and pnt8b of the electrode Dg1[i, j], and has a length greater than a linear distance between the points pnt8a and pnt8b. The jigsaw section between the points pnt7a and pnt7b crosses between the points pnt8a and pnt8b, and the jigsaw section between the points pnt8a and pnt8b crosses between the points pnt7a and pnt7b.

Figure 16:
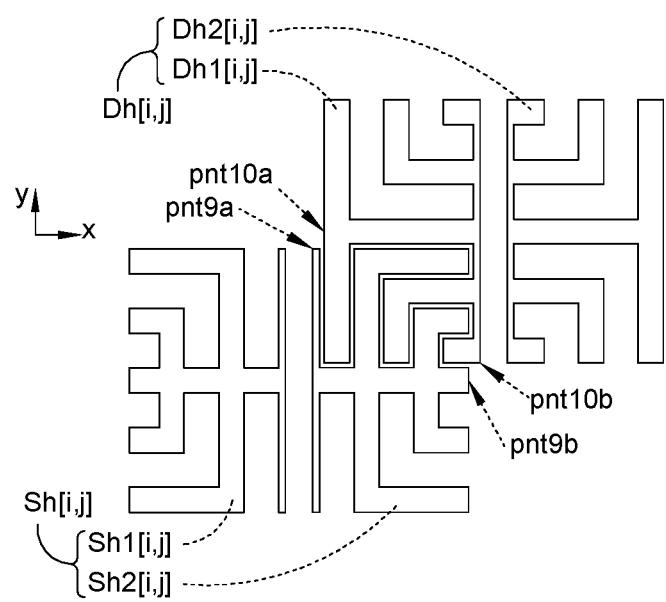

FIG. 16 shows electrodes Sh[i, j] and Dh[i, j] according to an embodiment of the present invention. The electrodes Sh[i, j] and Dh[i, j] may replace the electrodes Sd[i, j] and Dd[i, j] of the touch panel 10d (FIGS. 9 to 11), or the electrodes Se[i, j] and De[i, j] of the touch panel 10e (FIGS. 12 and 13). The electrode Sh[i, j] includes two electrodes Sh1[i, j] and Sh2[i, j] spaced by an insulation gap to form a path along y-axis for routings. The electrode Dh[i, j] includes two electrodes Dh1[i, j] and Dh2[i, j]] spaced by an insulation gap to form a path along y-axis for routings. A jigsaw section is formed between points pnt9a and pnt9b of the electrode Sh2[i, j], and has a length substantially greater than a linear distance between the points pnt9a and pnt9b. Correspondingly, a jigsaw section is formed between points pnt10a and pnt10b of the electrode Dh1[i, j], and has a length substantially greater than a linear distance between the points pnt10a and pnt10b.

Figure 17:
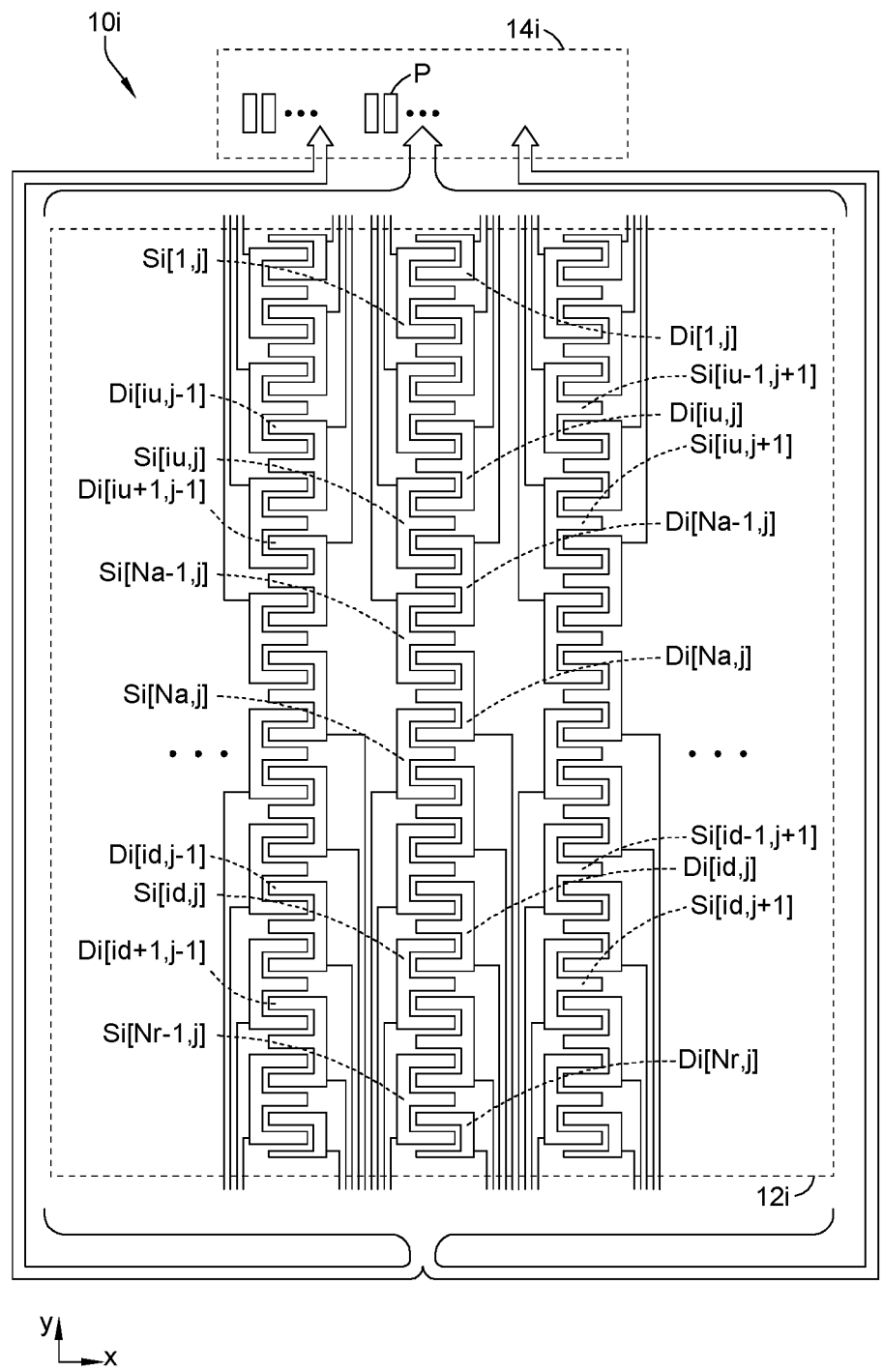
FIG. 17 and FIG. 18 show a touch panel according to an embodiment of the present invention.
Figure 18:
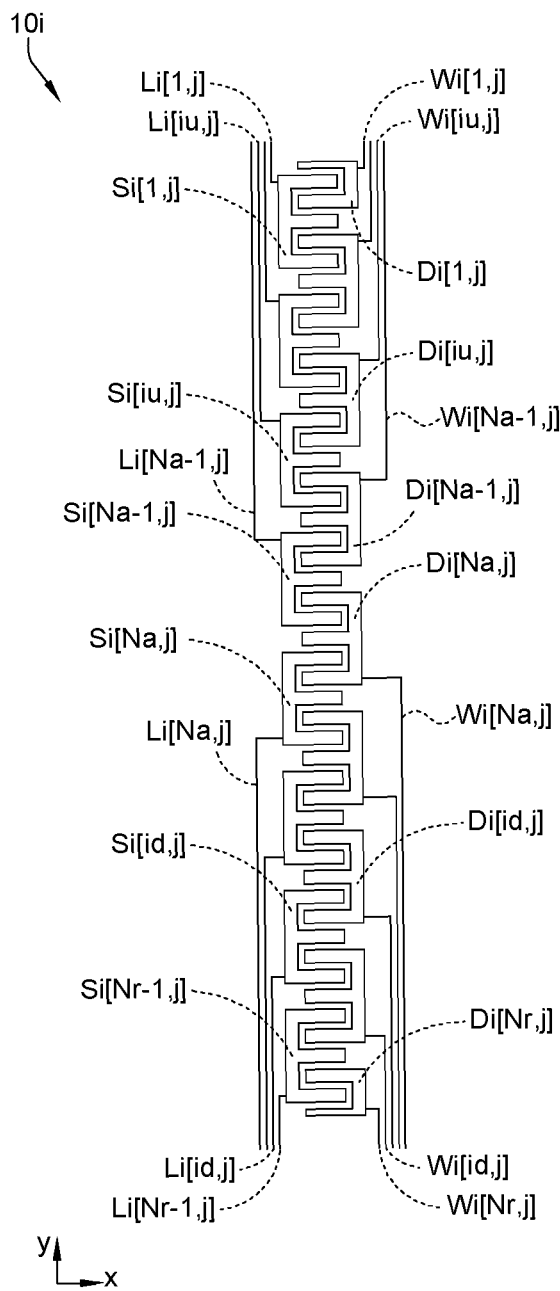

FIGS. 17 and 18 show a touch panel 10i according to an embodiment of the present invention. The touch panel 10i is capable of implementing the electrode arrangement and routings in FIG. 1. The touch panel 10i includes a touch control region 12i and a pad region 14i. The touch control region 12i includes electrodes Di[1, j] to Di[Nr, j] and electrodes Si[1, j] to Si[Nr−1, j], which are all disposed at a single conductive layer and respectively serve as the electrodes D[1, j] to D[Nr, j] and the electrodes S[1, j] and S[Nr−1, j] in FIG. 1.

Similar to the embodiment in FIG. 15, a border of the electrode Si[i, j] (where i may be iu or id) has two jigsaw sections that intervene with a part of borders of two neighboring electrodes Di[i, j] and Di[i+1, j] with an insulation gap in between. At one other side to the two jigsaw sections, the electrode Si[i, j] is spaced from two neighboring electrodes Di[i, j−1] and Di[i+1, j−1] by an insulation gap along the x-axis to form a routable y-axis channel.

Similarly, a border of the electrode Di[i, j] also has two jigsaw sections that intervene with a part of borders of the electrodes Si[i−1, j] and Si[i, j] with an insulation gap in between. At one other side to the two jigsaw sections, the electrode Di[i, j] is spaced from two neighboring electrodes Si[i−1, j+1] and Si[i, j+1] by an insulation gap along the x-axis to form a routable y-axis channel.

As shown in FIG. 18, the electrode Si[1, j] and the electrode Si[Na−1, j] are respectively connected to routings Li[1, j] and Li[Na−1, j]. An arbitrary electrode Si[iu, j] of the electrodes Si[1, j] to Si[Na−1, j] is connected to the routing Li[iu, j] located between the routings Li[1, j] and Li[Na−1, j]. The routings Li[1, j], Li[iu, j] to Li[Na−1, j] upwardly extend to pass through the upper side of the touch control region 12i and enter the pad region 14i. Among the electrodes Si[1, j] to Si[Na−1, j], when one electrode Si[iu2, j] is arranged between the electrodes Si[iu, j] and Si[Na−1, j] (i.e., iu<iu2<(Na−1)), a routing Li[iu2, j] connected to an electrode Si[iu2, j] is located between the routings L[iu, j] and L[Na−1, j]. Thus, the routings Li[1, j] to Li[Na−1, j] do not cross one another such that the electrodes may be formed at a single conductive layer.

The electrode Si[Na, j] and the electrode Si[Nr−1, j] are respectively connected to routings Li[Na, j] and Li[Nr−1, j]. An arbitrary electrode Si[id, j] among of the electrodes Si[Na, j] to Si[Nr−1, j] is connected to a routing Li[id, j] located between the routings Li[Na, j] and Li[Nr−1, j]. The routings Li[Na, j], Li[id, j] to Li[Nr−1, j] downwardly extend to pass through the lower side of the touch control region 12$i$, and wind along the periphery of the touch control region 12$i$ to enter the pad region 14$i$. Among the electrodes Si[Na, j] to Si[Nr−1, j], when one electrode Si[id2, j] is arranged between the electrodes Si[id, j] and Si[Nr−1, j] (i.e., id<id2<(Nr−1)), the routing Li[id2, j] connected to the electrode Si[id2, j] is located between the routings Li[id, j] and Li[Nr−1, j] to prevent the routings from crossing one another.

Similarly, the electrode Di[1, j] and the electrode Di[Na−1, j] are respectively connected to routings Wi[1, j] and Wi[Na−1, j]. An arbitrary electrode Di[iu, j] of the electrodes Di[1, j] to Di[Na−1, j] is connected to a routing Wi[iu, j]. The routing Wi[iu, j] is located between the routings Wi[1, j] and Wi[Na−1, j], and upwardly extends with the routings Wi[1, j] and Wi[Na−1, j] to pass through the upper side of the touch control region 12$i$ and enter the pad region 14$i$. The electrode Di[Na, j] and the electrode Di[Nr, j] are respectively connected to routings Wi[Na, j] and Wi[Nr, j]. An arbitrary electrode Di[id, j] of the electrodes Di[Na, j] to Di[Nr, j] is connected to a routing Wi[id, j]. The routing Wi[id, j] is located between the routings Wi[Na, j] and Wi[Nr, j], and downwardly extends with the routings Wi[Na, j] and Wi[Nr, j] to pass through the lower side of the touch control region 12$i$, and winds along the periphery of the touch control region 12$i$ to enter the pad region 14$i$.

In the embodiment in FIGS. 17 and 18, the shape of the electrode Si[i, j] may be the design of the electrode Sd2[i, j] (FIG. 11), Sf2[i, j] (FIG. 14), Sg2[i, j] (FIG. 15) or Sh2[i, j] (FIG. 16). Correspondingly, the shape of the electrode Di[i, j] may be the design of the electrode Dd1[i, j] (FIG. 11), Df2[i, j] (FIG. 14), Dg2[i, j] (FIG. 15) or Dh2[i, j] (FIG. 16).

In the touch panel 10$i$ in FIGS. 17 and 18, the routings of the electrodes are extended via the upper and lower sides of the touch control region 12$i$. Alternatively, the routings of the electrodes may all be extended into the pad region 14$i$ via the upper side of the touch control region 12$i$.

Figure 19:
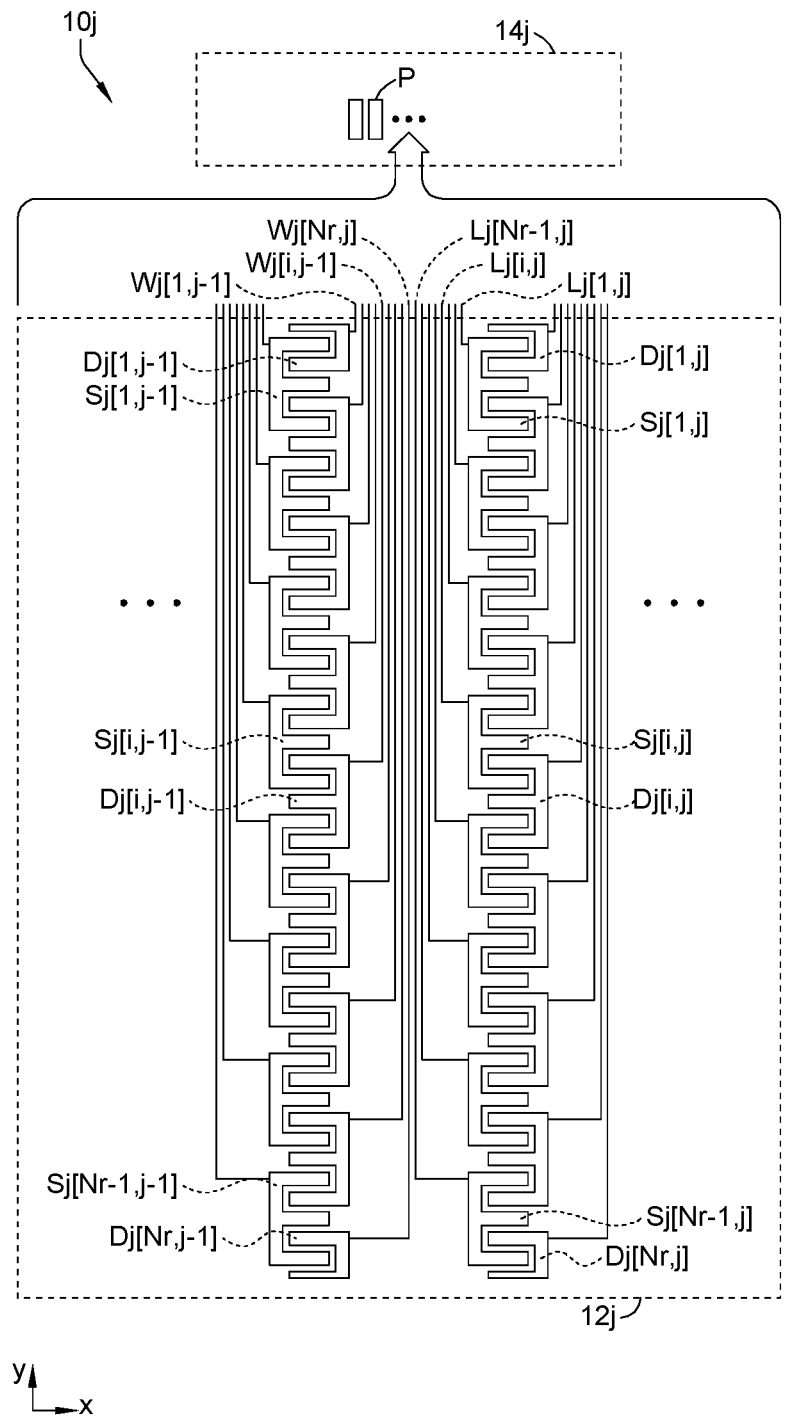
FIG. 19 shows a touch panel according to an embodiment of the present invention.

FIG. 19 shows a touch panel 10$j$ according to an embodiment of the present invention. The touch panel 10$j$ includes a touch control region 12$j$ and a pad region 14$j$. The touch control region 12$j$ includes electrodes Dj[i, j] to Dj[Nr, j] and electrodes Sj[1, j] to Sj[Nr−1, j], which are all formed at a single conductive layer and respectively serve as the electrodes D[1, j] to D[Nr, j] and the electrodes S[1, j] to S[Nr, j] in FIG. 1.

The electrodes Dj[1, j−1] and Dj[Nr, j−1] are respectively connected to routings Wj[1, j−1] and Wj[Nr, j−1]. An arbitrary electrode Dj[i, j−1] of the electrodes Dj[1, j−1] and Dj[Nr, j−1] is connected to a routing Wj[i, j−1]. Similarly, the electrodes Sj[1, j] and Sj[Nr−1, j] are respectively connected to routings Lj[1, j] and Lj[Nr−1, j]. An arbitrary electrode of the electrodes Sj[1, j] to Sj[Nr−1, j] is connected to a routing Lj[i, j].

In the touch control region 12$j$, between the electrodes Dj[1, j−1] to Dj[Nr, j−1] and the electrodes Sj[1, j] to Sj[Nr−1, j], a y-axis channel is formed. In the y-axis channel, the routing Wj[i, j−1] is located between the routings Wj[1, j−1] and Wj[Nr, j−1], and extends upwardly with the routings Wj[1, j−1] and Wj[Nr, j−1] to reach the pad region 14$j$. The routing Lj[i, j] is located between the routings Lj[1, j] and Lj[Nr−1, j], and upwardly extends with the routings Lj[1, j] and Lj[Nr−1, j] to reach the pad region 14$j$. The routing Wj[1, j−1] to Wj[Nr, j−1] and the routings Lj[Nr−1, j] to Lj[1, j] are kept free from crossing one another, and can thus be formed at a single layer with the electrodes.

Figure 20:
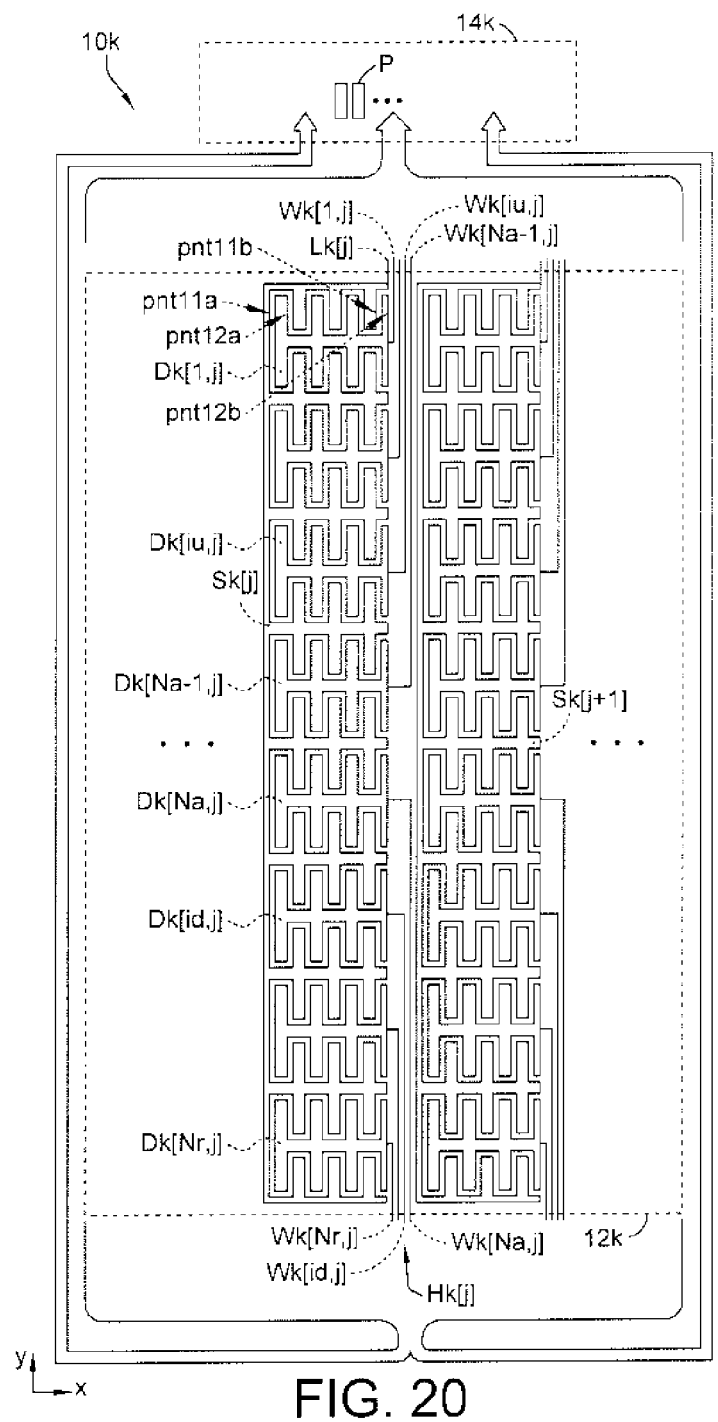
FIG. 20 shows a touch panel according to an embodiment of the present invention.

FIG. 20 shows a touch panel 10$k$ according to an embodiment of the present invention. The touch panel 10$k$ includes a touch control region 12$k$ and a pad region 14$k$. The touch control region 12$k$ includes an electrode Sk[j] and electrodes Dk[1, j] to Dk[Nr, j], which are disposed at a single conductive layer. The electrodes Dk[1, j] to Dk[Nr, j] may respectively implement the electrodes D[1, j] to D[Nr, j] (FIG. 1), and the electrode Sk[j] is equivalent to coupling the electrodes S[1, j] to S[Nr−1, j] together (FIG. 1). A border of the electrode Sk[j] has multiple jigsaw sections, which respectively intervene with the electrodes Dk[1, j] to Dk[Nr, j] with an insulation gap in between. For example, a jigsaw section is formed between points pnt11a and pnt11b of the electrode Sk[j]. Correspondingly, a jigsaw section is formed between points pnt12a and pnt12b of the electrode Dk[1, j]. The electrodes Dk[1, j] to Dk[Nr, k] and the electrode Sk[j+1] are also spaced by an insulation gap for forming a routable channel Hk[j] extending along the y-axis.

In the channel Hk[j], the electrode Sk[j] is connected to a routing Lk[j], and the electrodes Dk[1, j], Dk[Na−1, j], Dk[Na, j] and Dk[Nr, j] are respectively connected to routings Wk[1, j], Wk[Na−1, j], Wk[Na, j] and Wk[Nr, j]. An arbitrary electrode Dk[iu, j] of the electrodes Dk[1, j] to Dk[Na−1, j] is connected to a routing Wk[iu, j]. The routing Wk[iu, j] is located between the routings Wk[1, j] and Wk[Na−1, j], and upwardly extends with the routings Wk[1, j] and Wk[Na−1, j] (and the routing Lk[j]) to pass through the upper border of the touch control region 12$k$ to enter the pad region 14$k$. An arbitrary electrode Dk[id, j] of the electrodes Dk[Na, j] to Dk[Nr, j] is connected to a routing Wk[id, j]. The routing Wk[id, j] is located between the routings Wk[Na, j] and Wk[Nr, j], downwardly extends with the routings Wk[Na, j] and Wk[Nr, j] to pass through the lower border of the touch control region 12$k$, and winds along the periphery of the touch control region 12$k$ to enter the pad region 14$k$. Alternatively, the routing Lk[j] and the routings Wk[1, j] to Wk[Nr, j] all upwardly extend to pass through the upper side of the touch control region 12$k$ to enter the pad region 14$k$.

Figure 21:
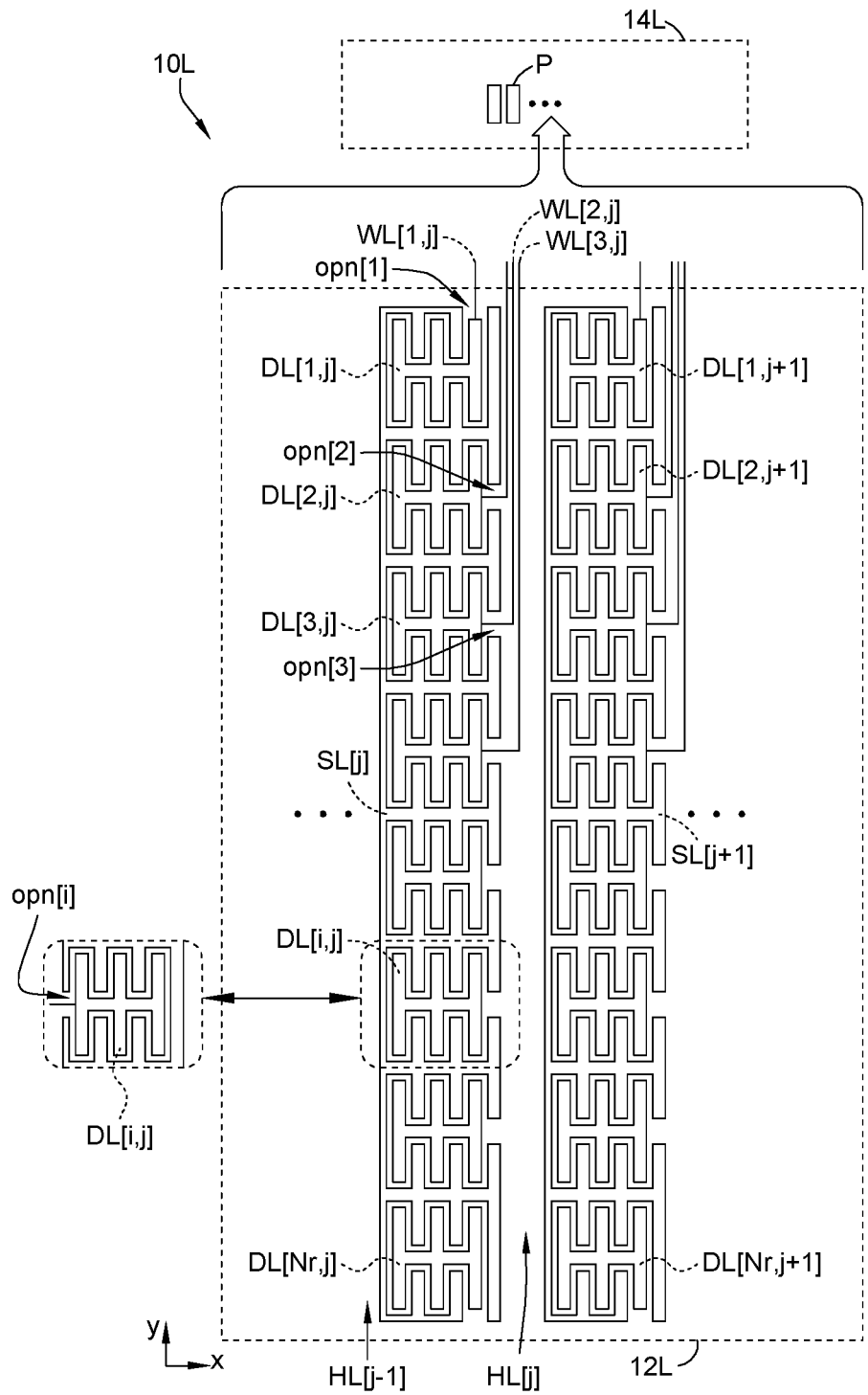
FIG. 21 shows a touch panel according to an embodiment of the present invention.

FIG. 21 shows a touch panel 10L according to an embodiment of the present invention. The touch panel 10L includes a touch control region 12L and a pad region 14L. The touch control region 12L includes electrodes SL[j] and electrodes DL[1, j] to DL[Nr, j], which are disposed at a single conductive layer. The electrodes DL[1, j] to DL[Nr, j] may respectively implement the electrodes D[1, j] to D[Nr, j] (FIG. 1), and the electrode SL[j] is equivalent to coupling the electrodes S[1, j] to S[Nr−1] together. A border of the electrode SL[j] has multiple jigsaw sections, which respectively intervene with the electrodes DL[1, j] to DL[Nr, j] with an insulation gap in between. The electrodes DL[1, j] to DL[Nr, k] and the electrode SL[j+1] are also spaced by an insulation gap for forming a routable channel HL[j] extending along the y-axis. An opening opn[1] is formed at the upper side of the electrode SL[j] to allow a routing WL[1, j] of the electrode DL[1, j] to upwardly extend. Multiple openings are also formed at the right side of the electrode SL[j], e.g., openings opn[2] and opn[3], to allow routings WL[2, j] and WL[3, j] of the electrodes DL[2, j] and DL[3, j] to extend to the right to the channel HL[j], and so forth. Alternatively, a particular part of the electrode SL[j] may also connect at the right side and form an opening opn[i] at the left side to allow a particular electrode(s) DL[i, j] to extend to the left to the channel HL[j−1].

In the touch panel 10L, the routings of the electrodes DL[1, j] to DL[Nr, j] may be divided into two groups that respectively pass through the upper and lower sides of the touch control region 12L, or all pass through the upper side of the touch control region 12L to extend to the pad region 14L.

Figure 22:
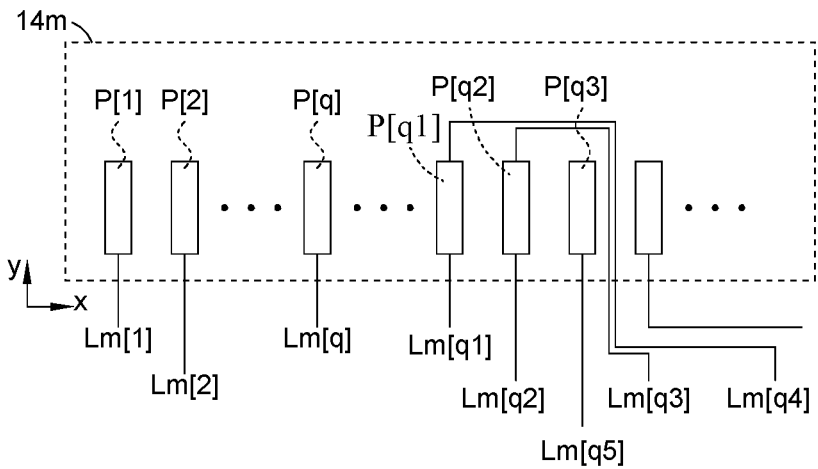
FIG. 22 shows pads and routings according to an embodiment of the present invention.

FIG. 22 shows a schematic diagram of pads and routings according to an embodiment of the present invention. The pads and routings of the embodiment are applied to a touch panel of the present invention. In FIG. 22, a pad region 14m commonly refers to the pad region 14a (FIG. 2), 14b (FIG. 4), 14c (FIG. 7), 14d (FIG. 9), 14e (FIG. 12), 14i (FIG. 17), 14j (FIG. 19), 14k (FIG. 20) and 14L (FIG. 21), and includes multiple pads, e.g., pads P[1], P[2] to P[q] and P[q1] to P[q3]. In the embodiment in FIG. 22, the pads are arranged in a row along the x-axis. Each of the pads P[q] connects at least one routing Lm[q] to a corresponding pad on a circuit board, e.g., a flexible circuit board (not shown), such that the routing Lm[q] connects to a corresponding sensor or driver via the circuit board. The routing Lm[1] commonly refers to a routing extended from an arbitrary electrode of the touch control region, e.g., the routings La1[iu, j], La2[iu, j], La1[id, j], La2[id, j], La[Na−1, j] and La[Na, j] (FIG. 3), the routings Lb[j], Lb1[j] and Lb2[j] (FIG. 5), the routings Wb[Nr, j], Wb1[i, j] and Wb2[i, j] (FIG. 6), the routings Lc[Nr−1], Lc1[i, j] and Lc2[i, j] (FIG. 8), the routings Ld[Na−1, j], Ld[Na, j], Ld1[iu, j], Ld2[iu, j], Ld1[id, j], Ld2[id, j], Wd[Na−1, j], Wd[Na, j], Wd1[iu, j], Wd2[iu, j], Wd1[id, j] and Wd2[id, j] (FIG. 10), the routings Le[Nr−1, j], Le1[i, j], Le2[i, j], We[Nr, j], We1[i, j] and We2[i, j] (FIG. 13), the routings Li[iu, j], Li[id, j], Wi[iu, j] and Wi[id, j] (FIG. 18), the routings Lj[i, j] and Wj[i, j−1] (FIG. 19), the routings Lk[j], Wk[iu, j] and Wk[id, j] (FIG. 20), and the routings Wl[1, j] to WL[3, j] (FIG. 21).

In FIG. 22, the routings of the same property may be connected to the same pad, i.e., the same pad may connect to multiple routings to reduce the number of pads. The routings of the same property refer to routings that need to be connected to the same sensor, the same driver or having the same voltage. For example, two routings extended from two sub-electrodes of a same electrode are routings of the same property. Further, as described with reference to FIG. 1, in various embodiments of the driving-sensing arrangement, different electrodes S[i1, j1] and S[i2, j2] may be connected to the same sensor, and therefore the routings of the electrodes S[i1, j1] and S[i2, j2] are of the same property. Similarly, different electrodes D[i1, j1] and D[i2, j2] may also be connected to the same driver, and so the routings of the D[i1, j1] and D[i2, j2] are of the same property.

As each pad occupies a substantial area and an appropriate distance needs to be kept between the pads. Thus, by connecting the routings of the same property to the same pad, the number of pads required can be significantly lowered to reduce the area occupied by the pads. As shown in FIG. 22, the routings Lm[q1] and Lm[q4] are of the same property, and can thus be connected to the same pad P[q1]. Similarly, the routings Lm[q2] and Lm[q3] are of the same property, and can thus be connected to the pad P[q2] via two ends of the pad P[q2]. To keep the routing Lm[q4] and the connection between the pad P[q1] to the routing Lm[q1] as well as the routing Lm[q3] and the connection between the pad P[q2] and the routing Lm[q2] free from crossing one another, the routings Lm[q2] and Lm[q3] are maintained between the routings Lm[q1] and Lm[q4], and the pad P[q2] to be connected to the routings Lm[q2] and Lm[q3] is also located between the routings Lm[q4] and Lm[q1]. Since the routing Lm[q4], the connection between the pad P[q1] and the routing Lm[q1] as well as the routing Lm[q3] and the connection between pad P[q2] and the routing Lm[q2] do not cross one another, the pads, the routings and the electrodes may be formed at a single conductive layer.

For example, the routing Lm[q5] connected to the pad P[q3] may be the routing La[Na−1, j] connected to the electrode Sa[Na−1, j] in FIG. 3. The routings Lm[q2] and Lm[q3] at the two sides of the routing Lm[q5] may be the routings La1[iu2, j] and La2[iu2, j] respectively connected to the electrodes Sa1[iu2, j] and Sa2[iu2, j]. The electrodes Sa1[iu2, j] and Sa2[iu2, j] are respectively located at two opposite sides of the routing Lm[q5], such that the connections of the electrode Sa2[iu2, j], the routing La2[iu2, j] (the routing Lm[q3], the pad P[q2], the routing La1[iu2, j] (the routing Lm[q2]) to the electrode Sa1[iu2, j] are encircled around the electrode Sa[Na−1, j], the routing La[Na−1, j] (the routing Lm[q5]) and the pad P[q3]. The routings Lm[q1] and Lm[q4] around the routings Lm[q2] and Lm[q3] may be the routings La1[iu, j] and La2[iu, j] in FIG. 3, which are respectively connected to the electrodes Sa1[iu, j] and Sa2[iu, j]. The connections of the electrodes Sa2[iu, j], the routing La2[iu, j] (the routing Lm[q4]), the pad P[q1], the routing La1[iu, j] (the pad Lm[q1]) to the electrode Sa1[iu, j] are encircled around the electrode Sa2[iu2, j], the routing La2[iu2, j] (the routing Lm[q3]), the pad P[q2], the routing La1[iu2, j] (the routing Lm[q2]) and the electrode Sa1[iu2, j]. The pad P[q2] is arranged between the pads P[q1] and P[q3], and the pads P[q1], P[q2] and P[q3] may also be three non-neighboring pads.

An appropriate driving-sensing arrangement allows different routings to share a same pad. For example, in the touch panel 10k in FIG. 20, the electrode Dk[id, j] may be connected to the driver DU[mod(j, 2)*i+mod(−1, 2)*(Nr−id+1)]. That is, the electrodes Dk[id, j] and Dk[Nr−id+1, j+1] are connected to the same driver. Thus, the routing Wk[1, j] and the routing Wk[Nr, j+1] may be connected to a same pad, e.g., the pad P[q1], the routing Wk[2, j] between the routings Wk[1, j] and Wk[Nr, j+1] and the routing Wk[Nr−1, j+1] may be connected to a same pad, e.g., the pad P[q2], and the routing Wk[3, j] between the routings Wk[2, j] and Wk[Nr−1, j+1] and the routing Wk[Nr−2, j+1] may be connected to a same pad, e.g., the pad P[q3], and so forth.

Figure 23:
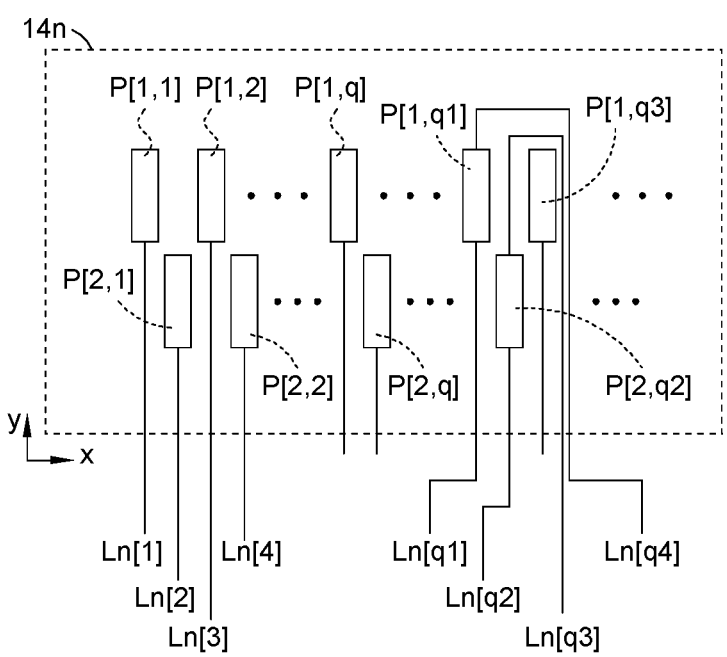
FIG. 23 shows pads and routings according to an embodiment of the present invention.

FIG. 23 shows a schematic diagram of pads and routings according to another embodiment of the present invention. As the pad region 14m shown in FIG. 22, a pad region 14n in FIG. 23 commonly refers to the pad region 14a (FIG. 2), 14b (FIG. 4), 14c (FIG. 7), 14d (FIG. 9), 14e (FIG. 12), 14i (FIG. 17), 14j (FIG. 19), 14k (FIG. 20) and 14L (FIG. 21), and includes multiple staggered pads, e.g., pads P[1, 1], P[1, 2] to P[1, q] and P[2, 1], P[2, 2] to P[2, q]. In FIG. 23, the pads are arranged in two rows. The pads P[1, 1], P[1, 2] to P[1, q] are arranged in one row along the x-axis, and the pads P[2, 1], P[2, 2] to P[2, q] are arranged in another row along the x-axis. The x coordinate of the pad P[2, 1] is between those of the pads P[1, 2] and P[1, 2], the x coordinate of the pad P[1, 2] is between those of the pads P[2, 1] and P[2, 2], and so forth. Each of the pads P[1, q] and P[2, q] are respectively connected to at least one routing. For example, the pads P[1, 1], P[1, 2], P[2, 1] and P[2, 2] are respectively connected to routings Ln[1] to Ln[4].

In FIG. 23, different routings of the same property may encircle pads of a same row and/or pads of different rows to connect to a same pad. The routings Ln[q1] and Ln[q4] of the same property may be respectively connected to two ends of the pad P[1, q1], and the other two routings Ln[q2] and Ln[q3] of the same property may be jointly connected to the pad P[2, q2] at another row. As the routings Ln[q2] and Ln[q3] stay between the routings Ln[q1] and Ln[q4], and the pad P[2, q2] to be connected to the routings Ln[q2] and Ln[q3] is also located between the routing Ln[q4] and the pad P[1, q1], the connections of the routing Lm[q4], the pad P[1, q1] to the routing Lm[q1] and the connections of the routing Lm[q3], the pad P[2, q2] to the routing Lm[q2] are kept free from intervening one another. That is, the pads in the staggered arrangement is capable of reducing the x-axis width of the pad region 14n, and different routings of the same property (routings connected to different electrodes) may also be connected to the same pad.

Figure 24:
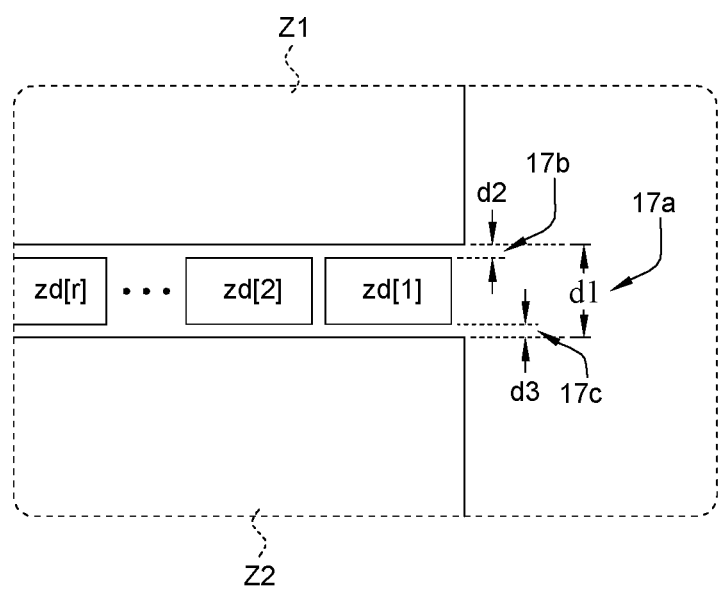
FIG. 24 shows a schematic diagram of dummy electrodes according to an embodiment of the present invention.

FIG. 24 shows an electrode arrangement according to an embodiment of the present invention. Two electrodes Z1 and Z2 are two neighboring electrodes in any of the foregoing embodiments, and are spaced by an insulation gap 17a having a distance d1. For example, the electrode Z1 may connect to a driver, and the electrode Z2 may connect to a sensor. In the gap 17a, a dummy electrode may be additionally disposed, e.g., dummy electrodes zd[1], zd[2] to zd[r]. The dummy electrodes zd[1] to zd[r] are insulated from one another, and are also insulated from the electrodes Z1 and Z2. For example, the dummy electrode zd[1] is spaced from the electrode Z1 by a gap 17b having a distance d2, and is spaced from the electrode Z2 by a gap 17c having a distance d3. Thus, the electrode Zd[r] is kept floating, and is unconnected to any circuit, including the sensors and drivers. With the stuffing provided by the dummy electrode zd[r], the insulation gap 17a between the electrodes Z1 and Z2 originally having a greater width is reduced to two gaps 17b and 17c having smaller distances. In other words, the dummy electrode zd[r] partially stuffs the gap 17a between the electrodes Z1 and Z2, in a way that the gap 17a appears less obvious to thus not only impose reduced effects upon image quality when the touch panel is integrated to a display panel but also benefits processing and manufacturing of the electrodes. Further, electric field power lines of the electrodes Z1 and Z2 may be first coupled to the dummy electrode zd[r] via the electrode Z1 and then coupled to the electrode Z2 via the dummy electrode zd[r]. Therefore, the dummy electrode zd[r] converges the power lines between the electrodes Z1 and Z2 to reduce the power line loss, thereby facilitating the sensing of mutual capacitance changes.

In conclusion, for a multi-touch touch panel cooperating drivers and sensors, a total solution is provided in various aspects from an electrode arrangement, a routing layout to a pad arrangement. As such, electrodes, routings and pads are allowed to form at a single conductive layer to further reduce the size, area and thickness of the touch panel while also lowering costs of the touch panel. Further, the regularity in the routing layout of the embodiment presents a spatial periodicity, thus allowing ambient electrical environment of the electrodes to approach consistency for enhancing touch sensing performance.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A touch panel, comprising:
a first electrode, being "E"-shaped, disposed at a conductive layer, wherein a border of the first electrode has two jigsaw sections;
a second electrode, being "E"-shaped, disposed at the conductive layer and insulated from the first electrode, wherein a border of the second electrode has two jigsaw sections;
a third electrode, being "E"-shaped, disposed at the conductive layer and insulated from the first electrode and the second electrode, wherein a border of the third electrode has two jigsaw sections; and
a fourth electrode, being "E"-shaped, disposed at the conductive layer and insulated from the first electrode, the second electrode and the third electrode, wherein a border of the fourth electrode has two jigsaw sections,
wherein one jigsaw section of the first electrode intervenes with one jigsaw section of the third electrode with an insulation gap in between, another jigsaw section of the third electrode intervenes with one jigsaw section of the second electrode with an insulation gap in between, another jigsaw section of the second electrode intervenes with one jigsaw section of the fourth electrode with an insulation gap in between, and
wherein the first electrode and the second electrode are connected to one or more drivers, and the third electrode and the fourth electrode are connected to one or more sensors.

2. The touch panel according to claim 1, further comprising:
a first routing, arranged on the conductive layer and connected to the first electrode;
a second routing, arranged on the conductive layer and connected to the second electrode;
a third routing, arranged on the conductive layer and connected to the third electrode; and
a fourth routing, arranged on the conductive layer and connected to the fourth electrode,
wherein the first and third routings are extended into a pad region via a first side of a touch control region, and the second and fourth routings are extended into the pad region via a second side of the touch control region that is opposite to the first side of the touch control region.

3. The touch panel according to claim 1, further comprising:
a first routing, arranged on the conductive layer and connected to the first electrode;
a second routing, arranged on the conductive layer and connected to the second electrode;
a third routing, arranged on the conductive layer and connected to the third electrode; and
a fourth routing, arranged on the conductive layer and connected to the fourth electrode;
wherein the first, second, third and fourth routings are extended into a pad region via a same side of a touch control region.

* * * * *